(12) United States Patent
Kurimoto

(10) Patent No.: US 8,028,210 B2
(45) Date of Patent: Sep. 27, 2011

(54) SEMICONDUCTOR DEVICE

(75) Inventor: Masanori Kurimoto, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/026,660

(22) Filed: Feb. 14, 2011

(65) Prior Publication Data

US 2011/0138217 A1 Jun. 9, 2011

Related U.S. Application Data

(62) Division of application No. 12/899,978, filed on Oct. 7, 2010, now Pat. No. 7,913,139, which is a division of application No. 12/171,606, filed on Jul. 11, 2008, now Pat. No. 7,827,454.

(30) Foreign Application Priority Data

Jul. 17, 2007 (JP) ................. 2007-185270
Feb. 5, 2008 (JP) ................. 2008-025436

(51) Int. Cl.
*G01R 31/28* (2006.01)
*G01R 31/26* (2006.01)
*G11C 29/00* (2006.01)
*G06F 17/50* (2006.01)
*G06F 9/45* (2006.01)
*G06F 11/00* (2006.01)
*H03K 19/00* (2006.01)
*G11B 5/00* (2006.01)
*G06K 5/04* (2006.01)

(52) U.S. Cl. .......... 714/731; 714/25; 714/700; 714/716; 714/718; 714/724; 714/815; 714/707; 714/719; 716/4; 716/6; 716/18; 365/201; 324/535; 324/764

(58) Field of Classification Search ........................ None
See application file for complete search history.

(56) References Cited

U.S. PATENT DOCUMENTS 5,223,755 A * 6/1993 Richley .................. 327/158
(Continued)

FOREIGN PATENT DOCUMENTS

JP 2005-214732 8/2005

OTHER PUBLICATIONS

Ernest, Dan et al., "Razor: Low-Power Pipeline Based on Circuit-Level Timing Speculation," IEEE Micro, 2004.

*Primary Examiner* — Jeffrey A Gaffin
*Assistant Examiner* — Guerrier Merant
(74) *Attorney, Agent, or Firm* — McDermott Will & Emery LLP

(57) ABSTRACT

An object of the present invention is to provide a semiconductor device capable of recognizing circuit malfunction in an actual operation and of specifying a point of the circuit malfunction, and the semiconductor device, which does not induce the malfunction in the circuit of a subsequent stage when restoring the malfunction. The present invention is the semiconductor device provided with a plurality of logic circuits and a plurality of judging circuits for judging malfunction based on data from the logic circuits, wherein each of the judging circuits is provided with a first register, delay unit, a second register, a comparator and scanning unit, which makes the second register a shift register to allow to transmit an error signal held in the second register to the subsequent stage, while allowing the comparator to hold a comparison result.

2 Claims, 35 Drawing Sheets

U.S. PATENT DOCUMENTS

| | | | |
|---|---|---|---|
| 5,301,196 A * | 4/1994 | Ewen et al. | 370/518 |
| 5,870,594 A * | 2/1999 | Doi et al. | 713/500 |
| 6,151,274 A * | 11/2000 | Takemae et al. | 365/233.1 |
| 6,476,643 B2 * | 11/2002 | Hugues et al. | 326/93 |
| 6,985,547 B2 | 1/2006 | Uht | |
| 7,188,284 B2 * | 3/2007 | Mitra et al. | 714/726 |
| 7,274,235 B2 * | 9/2007 | Nicolaidis | 327/225 |
| 7,482,831 B2 * | 1/2009 | Chakraborty et al. | 326/12 |
| 7,506,230 B2 * | 3/2009 | Chu et al. | 714/726 |
| 7,622,961 B2 * | 11/2009 | Grochowski et al. | 327/20 |
| 7,650,550 B2 * | 1/2010 | Ramaswami et al. | 714/731 |
| 7,904,772 B2 * | 3/2011 | Nicolaidis | 714/724 |
| 2006/0184852 A1 | 8/2006 | Chu et al. | |
| 2008/0209291 A1 * | 8/2008 | Ramaswami et al. | 714/731 |

* cited by examiner

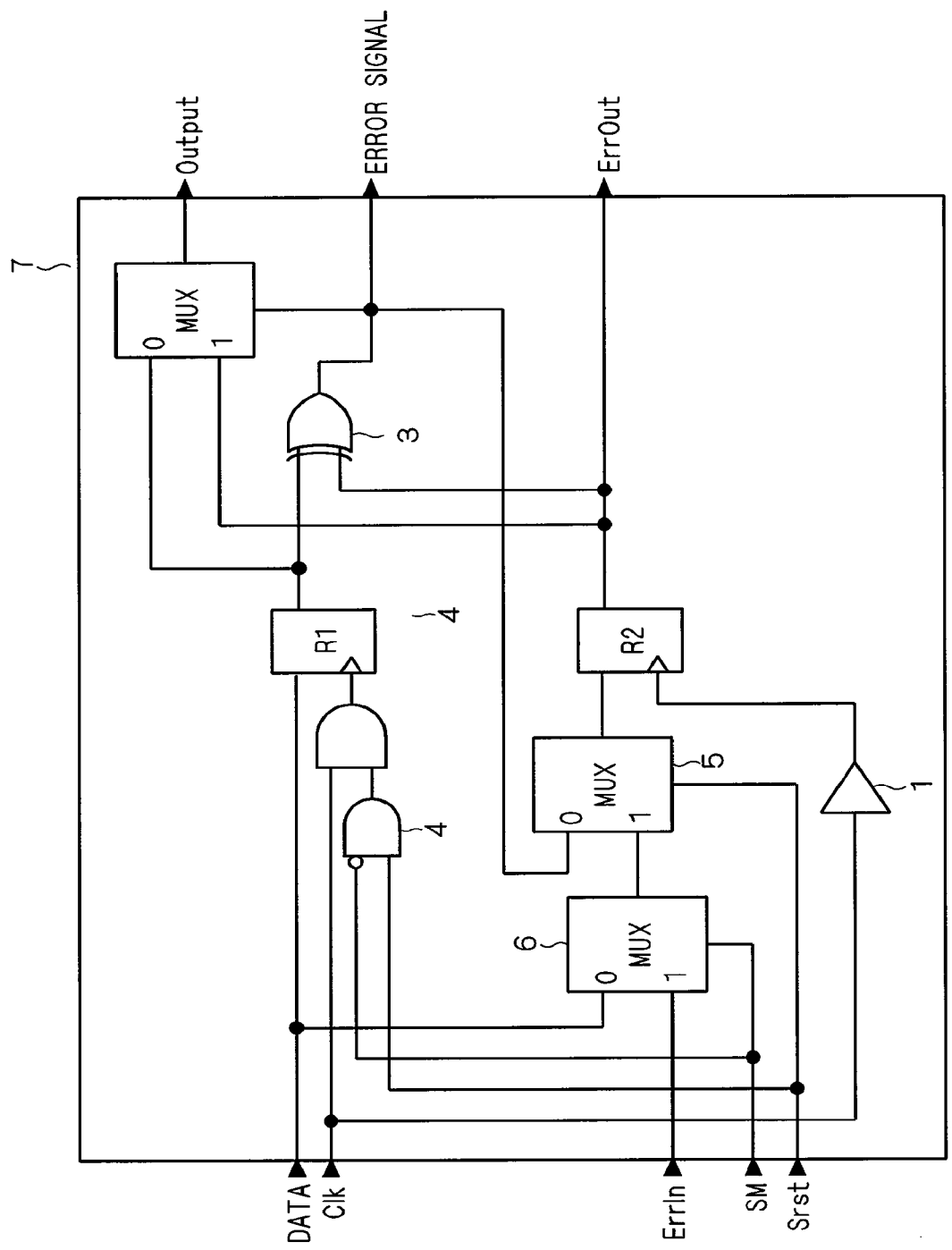
F I G. 4

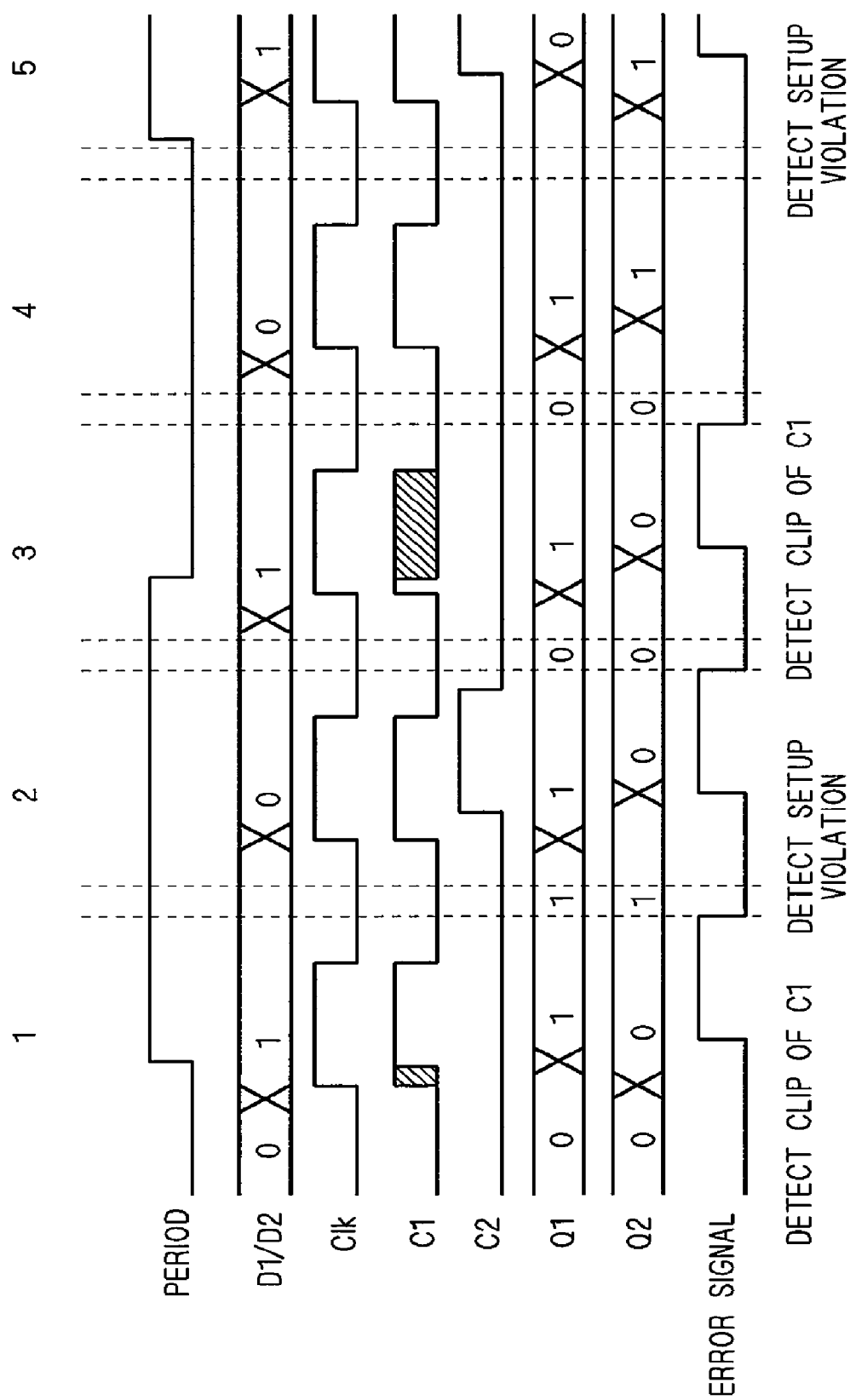

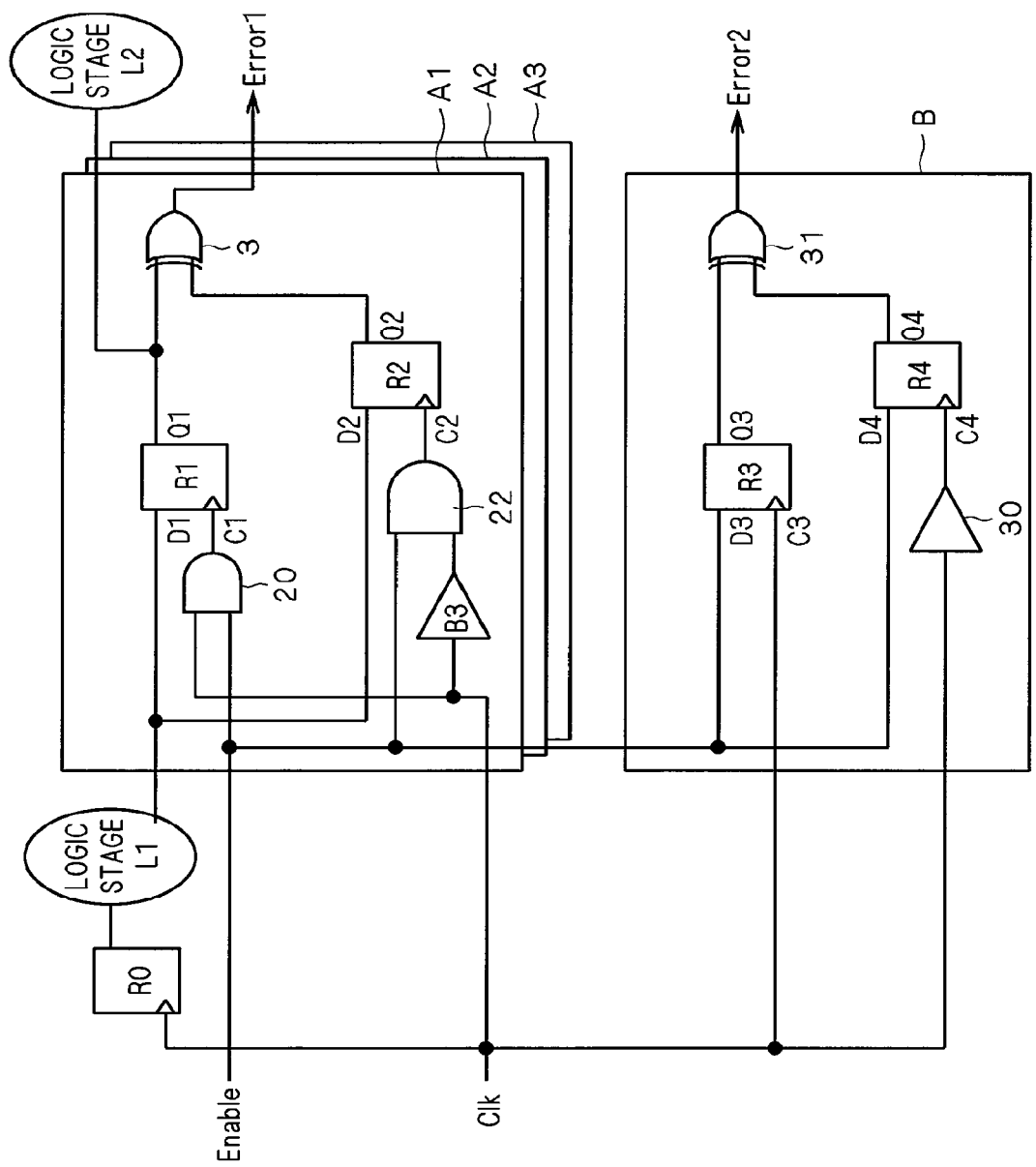
F I G. 1 2

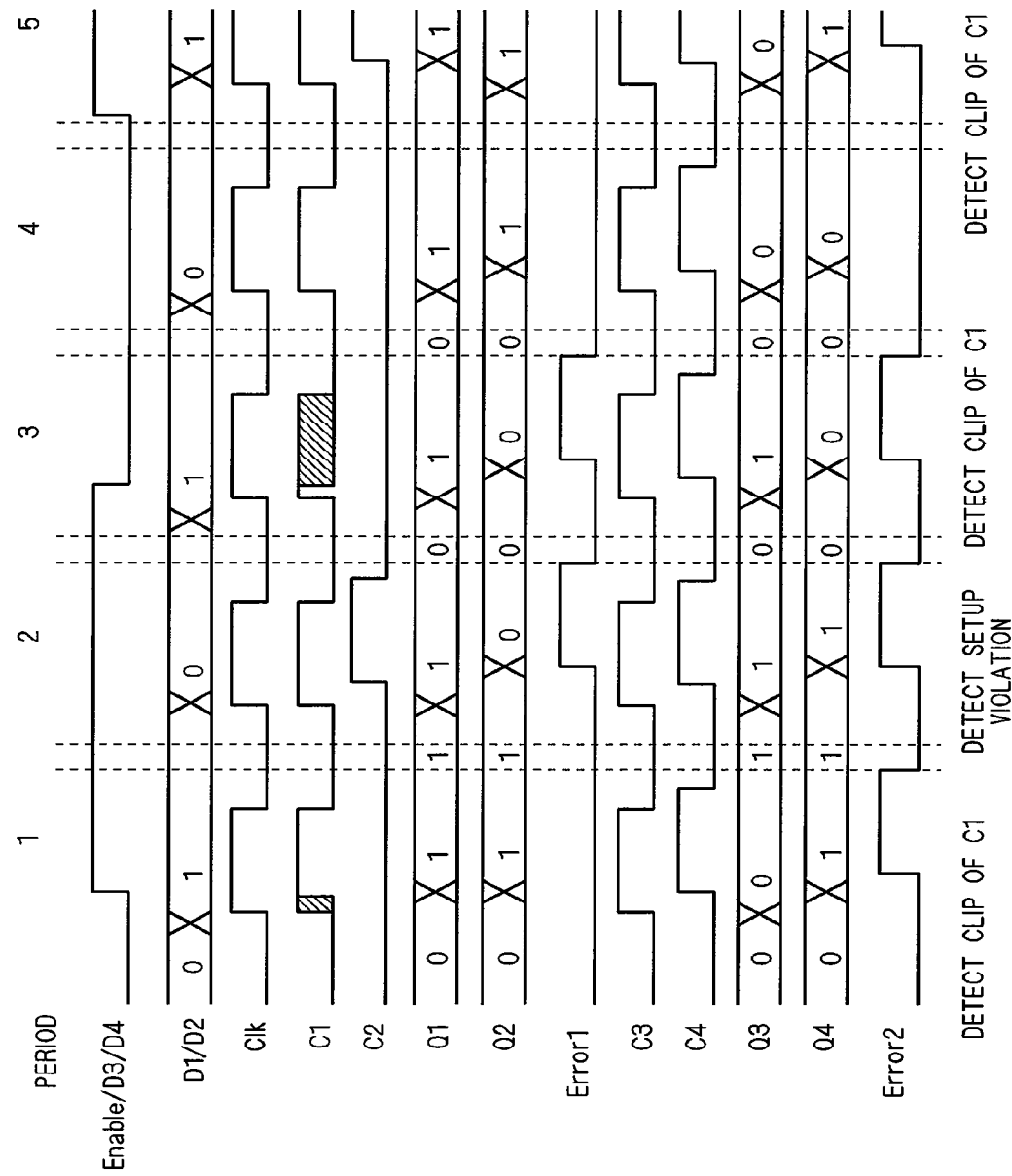

F I G . 1 9
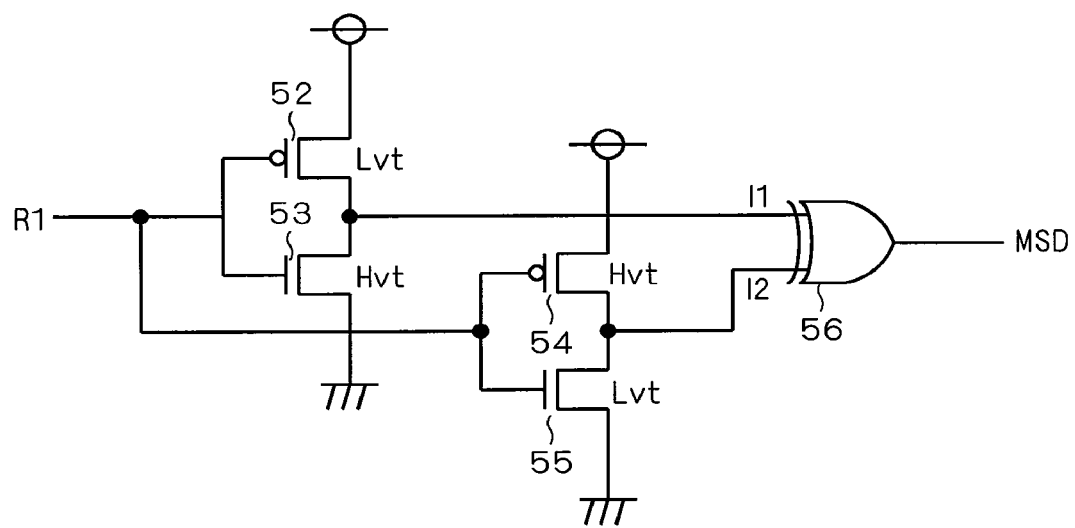

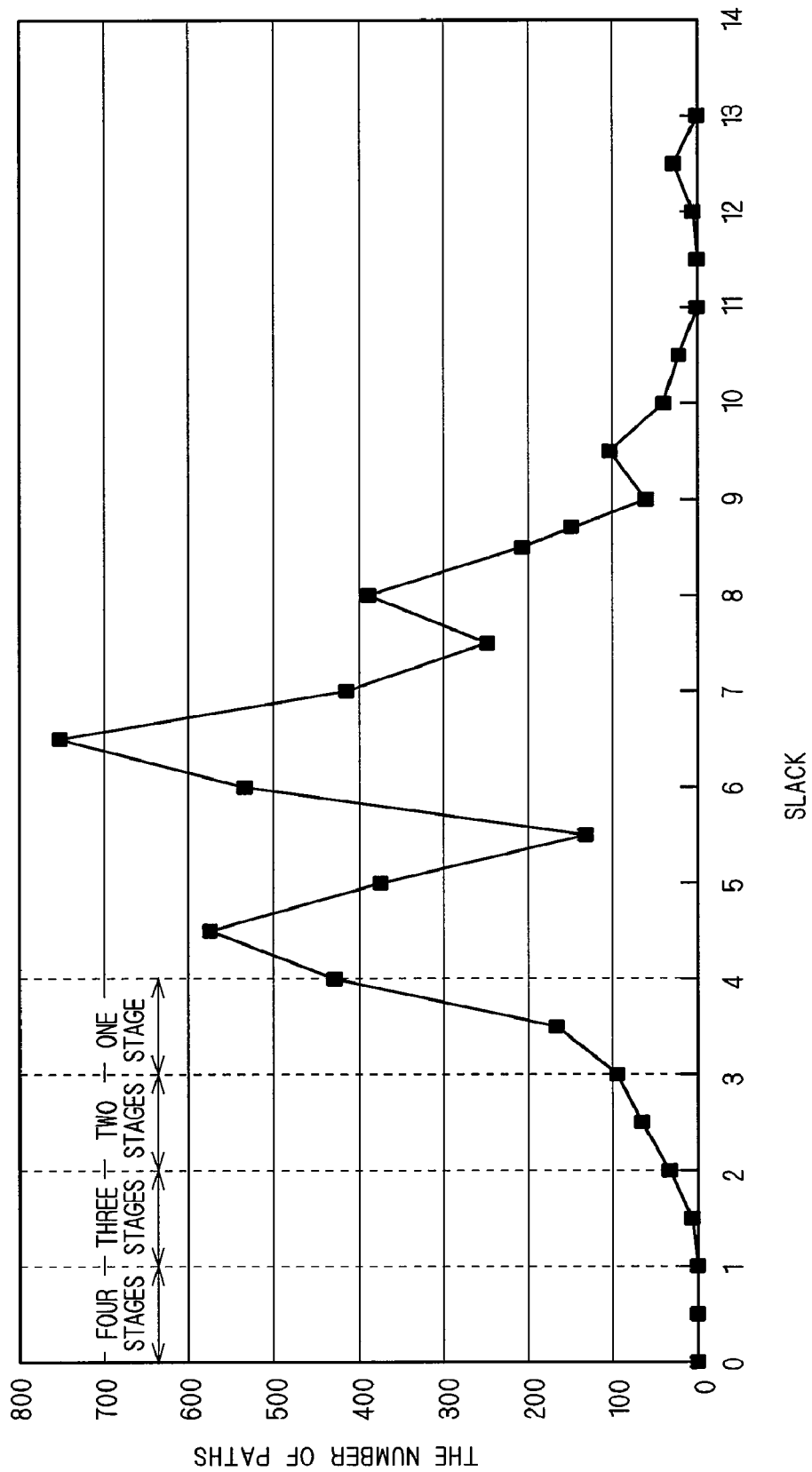

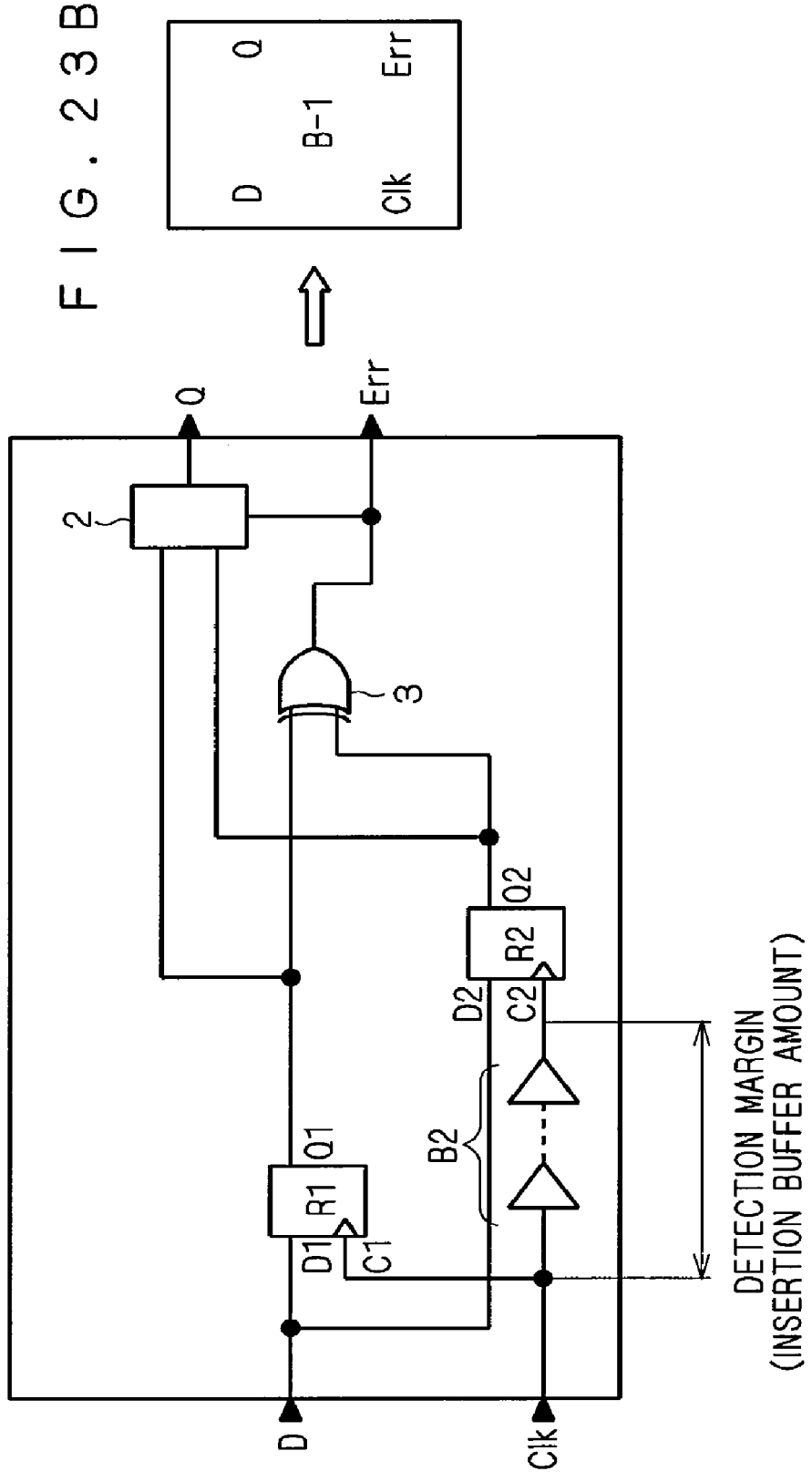

F I G . 2 4
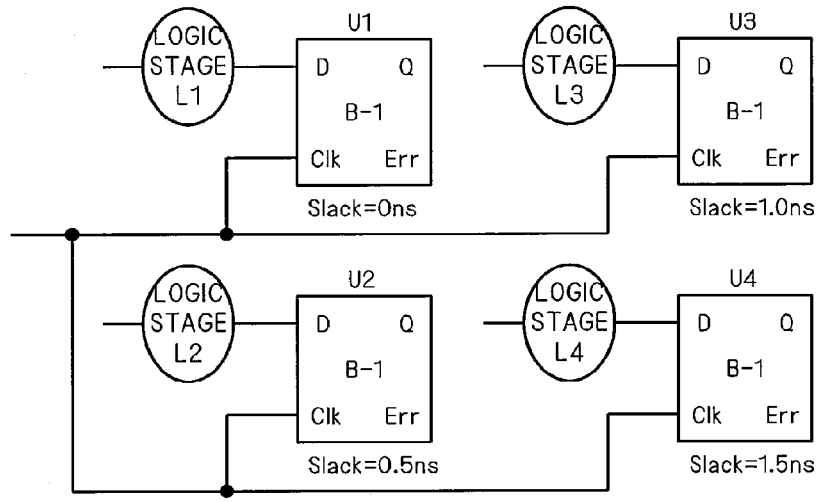
F I G . 2 5
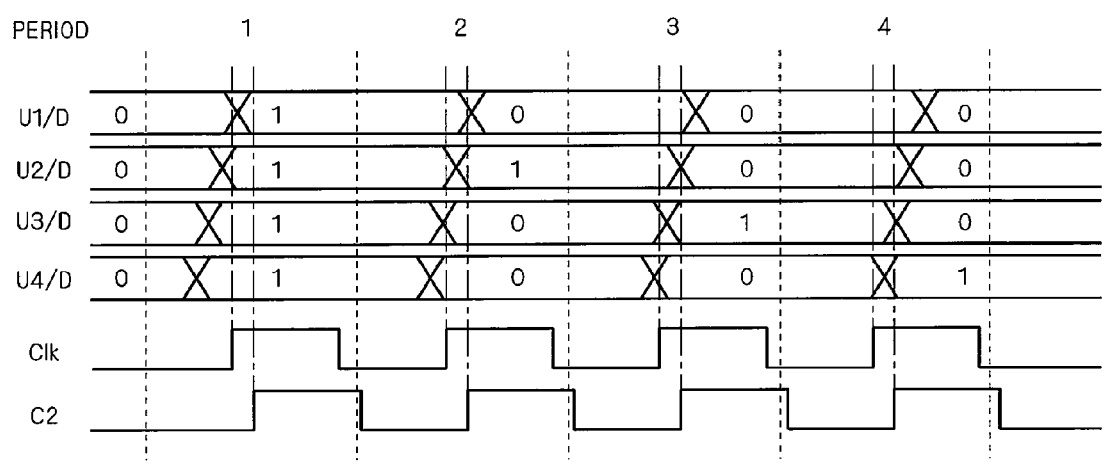

F I G . 2 6
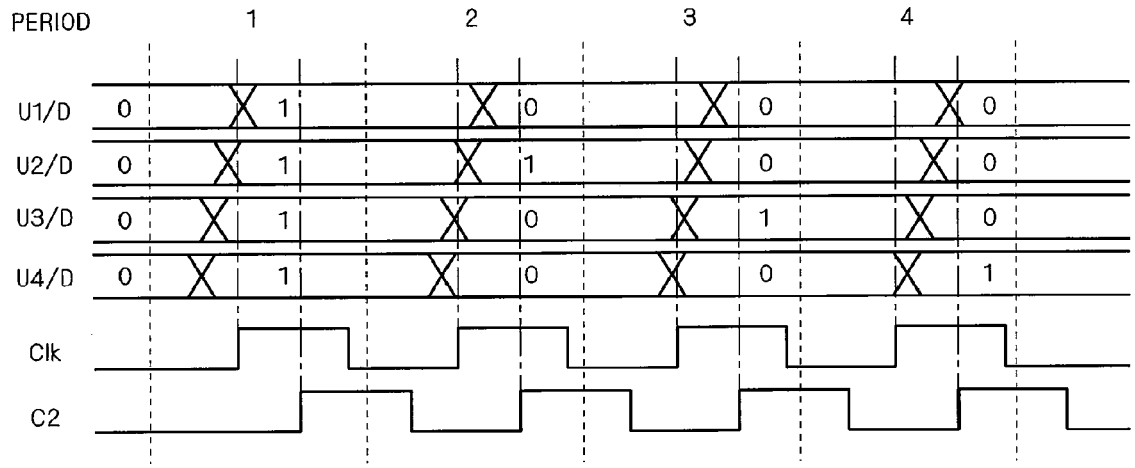
F I G . 2 7
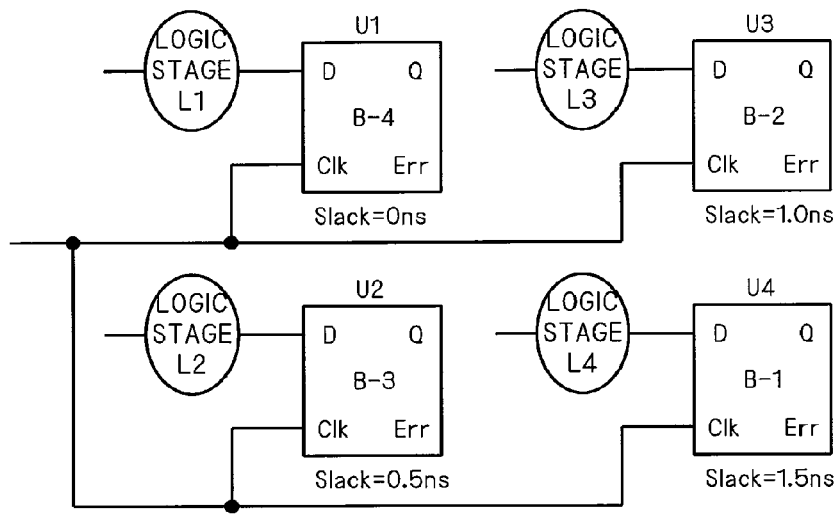

SEMICONDUCTOR DEVICE

RELATED APPLICATIONS

This application is a Divisional of U.S. patent application Ser. No. 12/899,978, filed on Oct. 7, 2010 now U.S. Pat. No. 7,913,139, which is a Divisional of U.S. patent application Ser. No. 12/171,606, filed on Jul. 11, 2008, now U.S. Pat. No. 7,827,454, which in turn claims the benefit of Japanese Application Nos. 2007-185270, filed on Jul. 17, 2007 and 2008-025436, filed on Feb. 5, 2008, the disclosures of which Applications are incorporated by reference herein.

BACKGROUND OF THE INVENTION

1. Field of the Invention

The present invention relates to a semiconductor device, and especially relates to the semiconductor device capable of detecting malfunction.

2. Description of the Background Art

In the semiconductor device, for reason of various dispersions, there is also the dispersion in a path delay having a certain memory element as an end point. The path delay operates without problem in a simulation, however, in an actual device, there has been a case in which a timing constraint (setup violation) is not satisfied due to the dispersion by the path delay and this does not operate.

Therefore, there has been a case to provide a mechanism for actively detecting the timing constraint in the semiconductor device. As such a mechanism, a circuit, so-called, Razor (hereinafter, referred to as a Razor circuit) disclosed in Dan Ernest, et al., "Razor: Low-Power Pipeline Based on Circuit-Level Timing Speculation", IEEE MICRO, 2004, pp. 10-20 is known. The Razor circuit disclosed in Dan Ernest, et al., "Razor: Low-Power Pipeline Based on Circuit-Level Timing Speculation", IEEE MICRO, 2004, pp. 10-20 is obtained by combining a flip-flop circuit for capturing data in synchronization with a rising edge of a clock signal clk and a latch circuit for capturing data in a High period of the clock signal clk. In addition, the Razor circuit has compared an output of the flip-flop circuit with that of the latch circuit by a comparator to switch the output of the flip-flop circuit, which is the general logic, and that of the latch circuit, by a selector circuit, based on the comparison result.

In the Razor circuit disclosed in Dan Ernest, et al., "Razor: Low-Power Pipeline Based on Circuit-Level Timing Speculation", IEEE MICRO, 2004, pp. 10-20, the latch circuit opens in synchronization with timing with which the flip-flop circuit captures data, and the latch circuit captures the data during the High period of the clock signal clk. That is to say, the Razor circuit disclosed in Dan Ernest, et al., "Razor: Low-Power Pipeline Based on Circuit-Level Timing Speculation", IEEE MICRO, 2004, pp. 10-20 detects the data reaching from rising of the clock signal clk until the High period of the clock signal clk as the malfunction (setup violation) by using a time difference between the flip-flop circuit and the latch circuit.

Next, in the U.S. Pat. No. 6,985,547, two sub synchronous circuits having the same configuration as that of a main synchronous circuit are provided, and the sub synchronous circuits have circuit configuration to operate at double periods of the main synchronous circuit. Therefore, the circuit disclosed in the U.S. Pat. No. 6,985,547 may restore the malfunction of the setup violation generated in the main synchronous circuit by the sub synchronous circuit.

Next, in the Japanese Patent Application Laid-Open No. 2005-214732, a combination logic circuit is interposed between a sending flip-flop circuit and a receiving flip-flop circuit, being operated by the same clock signal clk, as a critical path. In addition, in the Japanese Patent Application Laid-Open No. 2005-214732, the delay condition in the critical path is calculated and is displayed on an outer portion of the semiconductor device.

In order to specify the point at which the setup violation occurs, by providing a plurality of circuits in the semiconductor device disclosed in Dan Ernest, et al., "Razor: Low-Power Pipeline Based on Circuit-Level Timing Speculation", IEEE MICRO, 2004, pp. 10-20, it has been required to pick up the error signal output from each circuit. However, although a plurality of pins are required for picking up the error signal, the number of pins of the semiconductor device is limited, so that it has been general to bundle the error signals output from the circuits disclosed in Dan Ernest, et al., "Razor: Low-Power Pipeline Based on Circuit-Level Timing Speculation", IEEE MICRO, 2004, pp. 10-20 by an OR tree. Therefore, the conventional semiconductor device has had a problem that it is not possible to specify the point at which the setup violation occurs.

Also, in the circuits disclosed in Dan Ernest, et al., "Razor: Low-Power Pipeline Based on Circuit-Level Timing Speculation", IEEE MICRO, 2004, pp. 10-20, U.S. Pat. No. 6,985,547 and Japanese Patent Application Laid-Open No. 2005-214732, even if the setup violation is detected and the condition of the setup violation is restored, there has been a case in which the malfunction is induced in a subsequent stage.

Further, the condition to detect the setup violation in the semiconductor device is not constant and there is dispersion. Therefore, there has been a problem that there is a circuit in which the setup violation is not detected if one condition is fixed.

SUMMARY OF THE INVENTION

An object of the present invention is to provide the semiconductor device capable of recognizing circuit malfunction (setup violation) in an actual operation, and of specifying the point at which the circuit malfunction occurs.

A semiconductor device according to one embodiment of the present invention includes a plurality of logic circuits and a plurality of judging circuits for judging malfunction based on data from the logic circuits, wherein the judging circuit includes a first register for capturing the data from the logic circuits in a predetermined timing of a clock signal, delay means for delaying the clock signal, a second register logically equivalent to the first register, for capturing the data from the logic circuits in a predetermined timing of the clock signal, which has passed through the delay means, a comparator for comparing an output from the first register with an output from the second register to output an error signal, and scanning means for making the second register a shift register to allow to transmit the error signal held in the second register to a subsequent stage, while holding a comparison result of the comparator.

The semiconductor device according to one embodiment of the present invention includes the scanning means for making the second register a shift register to allow the error signal held in the second register to be transmitted to a subsequent stage, while holding a comparison result of the comparator, so that it is possible to specify one or more point(s) at which the circuit malfunction occurs.

These and other objects, features, aspects and advantages of the present invention will become more apparent from the

BRIEF DESCRIPTION OF THE DRAWINGS

FIGS. 3 and 4 are circuit diagrams of a malfunction judging circuit according to a first embodiment of the present invention;

FIG. 11 is a timing chart of the malfunction judging circuit according to the second embodiment of the present invention;

FIG. 12 is a circuit diagram of a malfunction judging circuit according to a third embodiment of the present invention;

FIG. 13 is a timing chart of the malfunction judging circuit according to the third embodiment of the present invention;

FIG. 19 is a circuit diagram of a metastability detection circuit according to the fifth embodiment of the present invention;

FIG. 22 is a view showing a relationship between slack and path;

FIGS. 23A and 23B are circuit diagrams of the malfunction judging circuit according to the sixth embodiment of the present invention;

FIG. 24 is a circuit diagram showing a configuration of a case in which a plurality of malfunction judging circuits according to the sixth embodiment of the present invention are provided;

FIGS. 25 and 26 are timing charts of the malfunction judging circuit according to the sixth embodiment of the present invention;

FIG. 27 is a circuit diagram of another configuration of a case in which a plurality of malfunction judging circuits according to the sixth embodiment of the present invention are provided;

DESCRIPTION OF THE PREFERRED EMBODIMENTS

First Embodiment

Figure 1:
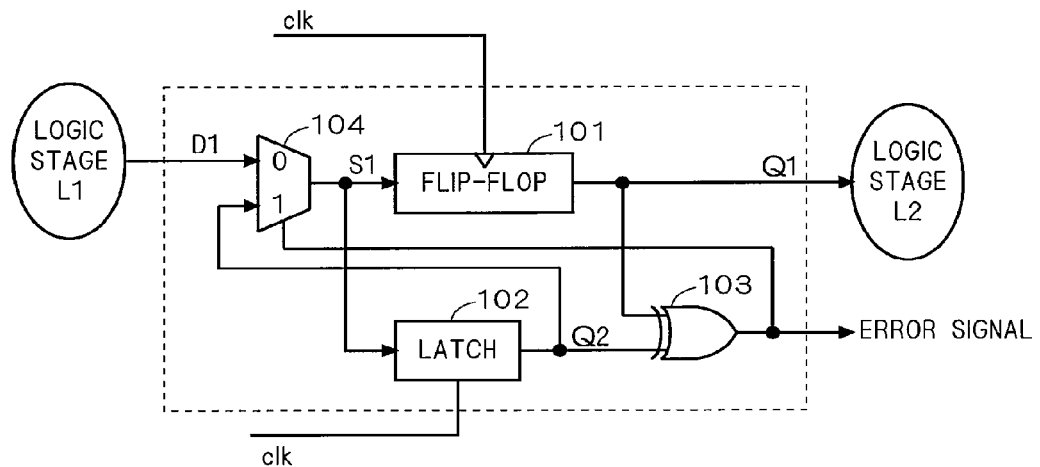
FIG. 1 is a circuit diagram of a circuit being a premise of the present invention.

Before describing a semiconductor device of the present invention, a configuration and a drive of a Razor circuit disclosed in Dan Ernest, et al., "Razor: Low-Power Pipeline Based on Circuit-Level Timing Speculation", IEEE MICRO, 2004, pp. 10-20 is described. FIG. 1 shows a circuit diagram of the Razor circuit, and FIG. 2 shows a timing chart of the Razor circuit.

The Razor circuit shown in FIG. 1 is provided with a flip-flop circuit 101 for capturing a data signal in synchronization with a rising edge of a clock signal clk, and a latch circuit 102 for capturing the data signal during a High period of the clock signal elk. Further, the Razor circuit shown in FIG. 1 is provided with a comparator 103 for comparing an output Q1 of the flip-flop circuit 101 and an output Q2 of the latch circuit 102, and a selector circuit 104 for switching a data signal D1 output from a logic stage L1, which is a logic circuit, and a data signal Q2 output from the latch circuit 102, depending on a result of the comparator 103. Also, the latch circuit 102 shown in FIG. 1 captures a data signal S1 output from the selector circuit 104 during the High period of the clock signal clk. In addition, the Razor circuit shown in FIG. 1 detects an event of the data signal reaching from the rising of the clock signal clk until the High period of the clock signal clk as malfunction (setup violation), using a time difference between the flip-flop circuit 101 and the latch circuit 102.

However, a malfunction detection performed in the Razor circuit has had following problems. First, in the timing chart for three periods shown in FIG. 2, the timing is off and the setup violation occurs only in a second period, and the data normally reaches in other periods (first and third periods). In the second period in this case, the flip-flop circuit 101 captures "1" at a rising timing of the clock signal clk, since arrival of an event of the data signal changing from "1" to "0" is not in time. On the other hand, the latch circuit 102 captures "0", which is the data signal when the clock signal clk is in the High period. Therefore, the Razor circuit asserts an error signal as intended.

Figure 2:
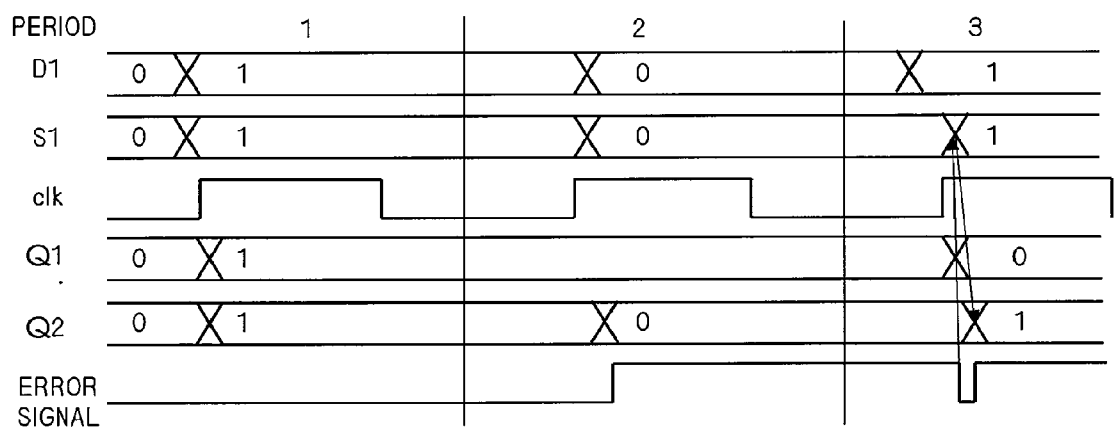
FIG. 2 is a timing chart of the circuit being a premise of the present invention.

Next, in the third period shown in FIG. 2, since the event of the data signal changing from "0" to "1" reaches at the rising timing of the clock signal clk, the setup violation does not occur essentially. However, the error signal asserted in the second period is not negated in the third period. This is because, at the rising timing of the clock signal clk of the third period, although it is required to capture the data signal D1 output from the logic stage L1, the data signal Q2 output from the latch circuit 102 is captured, since the error signal of the second period is not negated.

As a result, when the error signal is negated and a path from the logic stage L1 becomes active (up-pointing arrow in FIG. 2), the flip-flop circuit 101 already captures "0" latched by the latch circuit 102, so that only the latch circuit 102 captures the event of the data signal changing from "0" to "1" (down-pointing arrow in FIG. 2). Therefore, in the comparator 103, a data signal Q1 output from the flip-flop circuit 101 and a data signal Q2 output from the latch circuit 102 do not conform to each other, and the error signal is asserted even though the setup violation does not occur.

Figure 3:
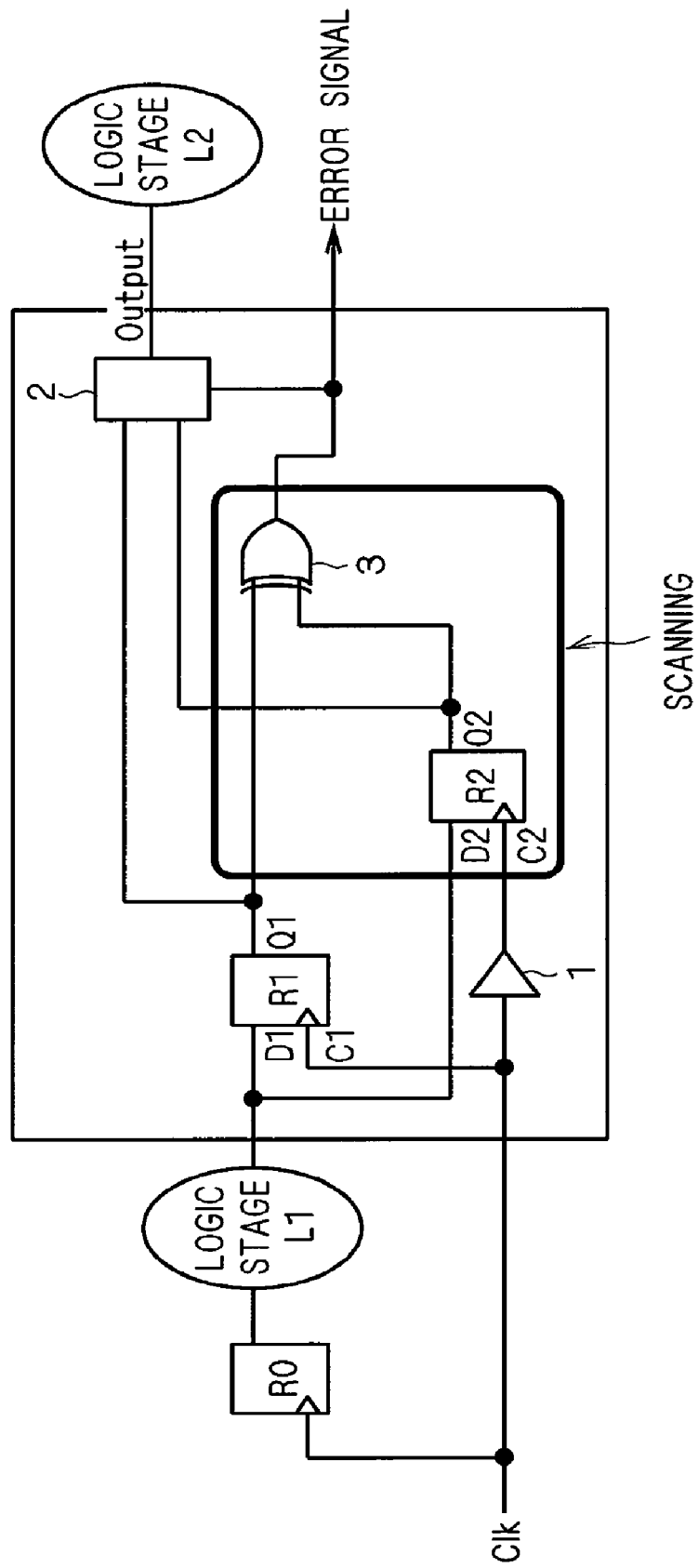

Then, a circuit diagram of a malfunction judging circuit (error detection flip-flop circuit (FF)) solving the above-described problem is shown in FIG. 3. The circuit shown in FIG. 3 is provided with a register R2, which is an expectation value register (ExpectRegister) in which positive-slack in the timing is left by inserting a buffer 1 into a line of the clock signal (clk), as opposed to a register R1, which is a target register. Then, the data signal D1 output from the previous logic stage L1 is input to the register R1. On the other hand, the data signal Q1 output from the register R1 is output to a subsequent logic stage L2 through a selection circuit 2 (output signal) and is input to the comparator 3.

The comparator 3 compares the data signal Q1 output from the register R1 with the data signal Q2 output from the register R2, and when both signals are not conform to each other, outputs the error signal (Error). That is to say, in the circuit shown in FIG. 3, the register R2 in which a setup violation condition is eased is provided by inserting the buffer 1 into the clock line, and the malfunction is detected by comparing the outputs from the registers R1 and R2 in the comparator 3. Therefore, in the circuit shown in FIG. 3, the problem that the error signal is asserted even though the setup violation does not occur, as in the Razor circuit, may be avoided by providing the buffer 1.

Also, the circuit shown in FIG. 3 is the malfunction judging circuit, which outputs existence or nonexistence of the setup violation as the error signal, as described above. Therefore, in the semiconductor device provided with the circuit shown in FIG. 3 (LSI or the like), the circuit shown in FIG. 3 replaces the flip-flop circuit, which is difficult in the timing, out of those normally used for logic. Also, it is required to specify from which circuit the error signal is output, when building a plurality of circuits shown in FIG. 3 into the semiconductor device.

However, since the number of pins of the semiconductor device is limited, it is not possible to assign the pin for every error signal from each circuit, so that the error signals are bundled together by an OR tree and are output to outside of the semiconductor device (not shown). Therefore, in the circuit shown in FIG. 3, it is possible to judge that the setup violation occurs in the semiconductor device, however, it is not possible to specify the circuit in which the set up violation occurs.

Therefore, the semiconductor device according to this embodiment is further provided with means for making the register R2, which is the expectation value register, shown in FIG. 3, a shift register to scan (hereinafter, also referred to as scanning means), and transmits the error signal by using the means to push out the same, thereby specifying the circuit in which the violation occurs. Meanwhile, this circuit configuration is the technique effective not only in controlling a voltage but also in analyzing a fail point using an actual operation (performance) pattern.

Next, a circuit configuration provided with scanning means is specifically shown in FIG. 4. However, the scanning means shown in FIG. 4 is one example, so that the present invention is not limited to this, and another circuit configuration may be used as long as this is the scanning means having similar function.

In the circuit shown in FIG. 4, an AND circuit 4 is provided in the line of the clock signal Clk of the register R1. The AND circuit 4 is provided with an AND circuit 4a to which an inverted signal of a scan mode signal (SM) and a scan reset signal (Srst) are input, and an AND circuit 4b to which the clock signal Clk and an output from the AND circuit 4a are input. Also, in the circuit shown in FIG. 4, a multiplexer (MUX) 5 is provided in a previous stage of the register R2, and the error signal (Error), which is an output from the comparator 3 of the previous stage, an output from an MUX 6 and the Srst signal are input to the MUX 5. An error in signal (ErrIn), which is equivalent to a scan in signal (SI) in a normal scan cell, the Srst signal and a data signal (DATA) from the logic circuit of the previous stage are input to the MUX 6.

Although an MUX 7 is used in place of the selection circuit 2 in the circuit shown in FIG. 3, in the circuit shown in FIG. 4, a function thereof is equivalent. In addition, another circuit shown in FIG. 4 is the same as the circuit shown in FIG. 3, so that a detailed description thereof is omitted.

In the circuit shown in FIG. 4, an error out signal (ErrOut) output from the register R2 is equivalent to a scan out signal (SO) in the normal scan cell, and the ErrOut signal of a certain error detection FF connects to the ErrIn signal of another error detection FF to form a scan path.

The SM signal is the signal for controlling a mode of the scan, and when this is "0", this is in a normal operation mode and controls the MUX 6 such that the register R2 may capture the data signal at the rising time of the clock signal. Also, when the SM signal is "1", this is in a scan mode and controls the MUX 6 such that the register R2 may capture a value of the ErrIn signal at the rising time of the clock signal.

Further, the Srst signal is a reset signal at the time of mode switching and decides an initial condition in each mode (normal or scan). That is to say, when the Srst signal is "0", the register R2 captures the value of the error signal through the MUX 5, and when the Srst signal is "1", the register R2 captures the value of the signal selected by the SM signal (DATA or ErrIn) through the MUX 5. As a summary of the above-description, a truth table when scanning the register R2 is shown in Table 1. Meanwhile, "*" in the Table 1 indicates an optional value. Also, "(R2&!R1)|(!R2&R1)" in the Table 1 indicates that the register R2 holds a comparison result of expectation values and that when the comparison result is "0" (not error), directly outputs the register R1, and when the comparison result is "1" (error), outputs an inversion of the register R1.

TABLE 1

| SM/Srst | Clk | ErrorOut |
|---|---|---|
| 00 | rise | (R2 & !R1)\|(!R2 & R1) (=Error) |
| 01 | rise | DATA |
| 10 | rise | Error |
| 11 | rise | ErrIn |
| ** | others | — |

Therefore, by scanning the register R2 to control the SM signal and the Srst signal as indicated in the Table 1, it becomes possible to transmit the error signal at the time of setup violation, thereby specifying a point at which the setup violation occurs. Meanwhile, the circuit configuration not only specifies the point at which the setup violation occurs, but also sets the initial value of the register R2 through the scan path, as in the normal scan circuit.

Further, in the circuit shown in FIG. 4, in the scan mode in which the SM signal is "1", the clock signal Clk input to the register R1 is disenabled in the AND circuit 4 and a circuit operation of the register R1 is stopped. Therefore, in the scan mode in which the SM signal is "1", contents of the register R1 are held in a condition before the clock signal is disenabled and when it becomes again the normal operation mode in which the SM signal is "0", the operation of the register R1 may be restarted. Also, since the circuit operation of the register R1 is stopped in the scan mode, it is possible to reduce power consumption in this period.

Figure 5:
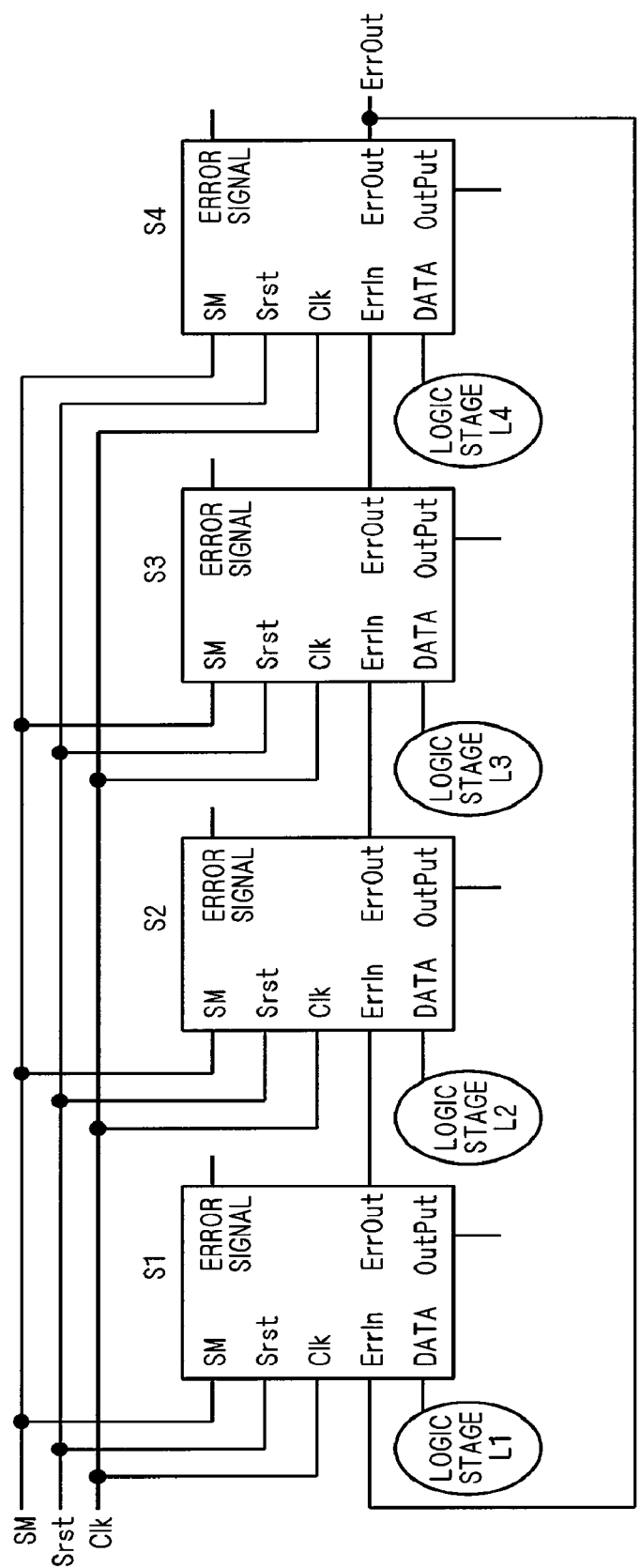
FIG. 5 is the circuit diagram showing a configuration of a case in which a plurality of malfunction judging circuits according to the first embodiment of the present invention are provided.

FIG. 5 shows a circuit diagram in which four stages of circuits shown in FIG. 4 are disposed to form the scan path from the ErrOut signal to the ErrIn signal of each circuit (S1 to S4). In FIG. 5, the logic stage L1 is connected to a previous stage of the circuit S1, the logic stage L2 is connected to a previous stage of the circuit S2, a logic stage L3 is connected to a previous stage of the circuit S3, and a logic stage L4 is connected to a previous stage of the circuit S4, respectively. Further, in FIG. 5, by directly connecting the ErrOut signal output from the circuit S4 as the ErrIn signal of the circuit S1, it is configured that a shift takes a round to back to an initial state. However, the present invention is not limited to this, and it is also possible to set the ErrIn signal of the circuit S1 to an optional value from an outer terminal.

Figure 6:
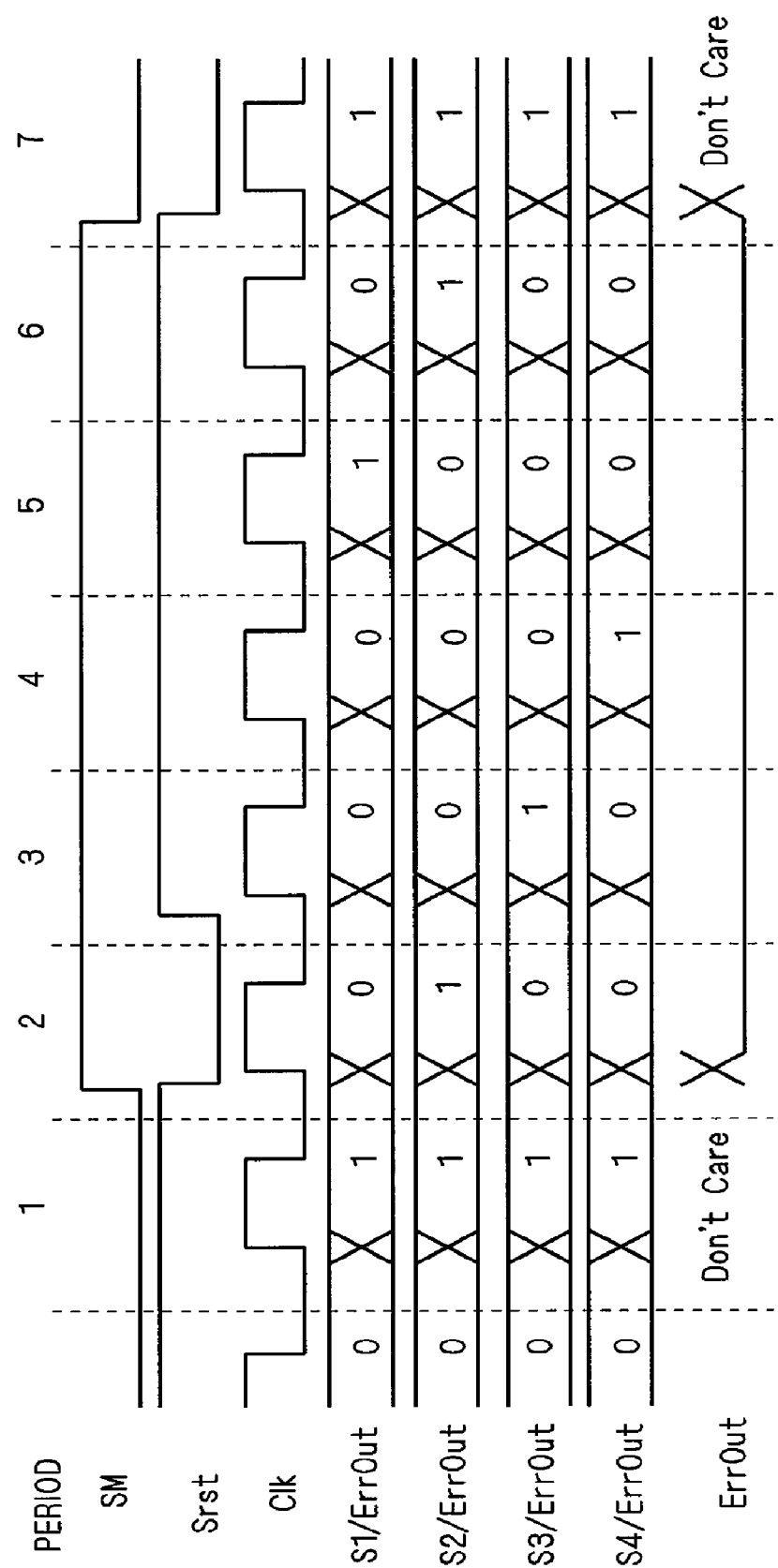
FIG. 6 is a timing chart of the malfunction judging circuit according to the first embodiment of the present invention.

Next, an operation of the circuit shown in FIG. 5 is described based on a timing chart shown in FIG. 6. First, in a first period of the timing chart shown in FIG. 6, it is supposed that the circuit S2 detects the malfunction of the setup violation. Then, since it is in the normal operation mode, the value of the ErrOut signal is not the error signal in each circuit S1 to S4 but the value of the register R2, and the expectation value in this period is supposed to be "1" for every four bits. Meanwhile, since the value of the register R1 of the circuit S2 is supposed to be the setup violation, this does not conform to the expectation value and is "0".

Next, in a second period, the SM signal becomes "1" and it is switched to the scan mode. At the same time, the Srst signal is asserted to "0", so that the value of the error signal of each circuit will be captured by the register R2. Since it is supposed that the malfunction occurs in the first period only in the circuit S2, only the value of the ErrOut signal of the circuit S2 becomes "1" in the second period, and the values of the ErrOut signals of other circuits S1, S3 and S4 become "0". Meanwhile, since the SM signal becomes "1", all of the clock signals supplied to each register R1 in the circuits S1 to S4 are disenabled.

Next, in a third period, since the Srst signal becomes "1", each of the ErrOut signals of each circuit S1 to S4 will capture the ErrOut signal of the previous stage. Therefore, the ErrOut signal of the circuit S3 becomes "1" by capturing the value of the ErrOut signal in the circuit S2 of the second period, and all of the ErrOut signals of other circuits S1, S2 and S4 become "0". Herein, the value of the ErrOut signal of the circuit S4 is supplied to the ErrOut signal of the circuit S1.

Next, in a fourth period, the process similar to that of the third period is performed, and the ErrOut signal of the circuit S4 becomes "1" by capturing the value of the ErrOut signal in the circuit S3 of the third period, and all of the ErrOut signals of other circuits S1, S2 and S3 become "0". Further, in a fifth period also, the process similar to that of the fourth period is performed, and the ErrOut signal of the circuit S1 becomes "1" by capturing the value of the ErrOut signal in the circuit S4 of the fourth period, and all of the ErrOut signals of other circuits S2, S3 and S4 become "0". In a sixth period also, the process similar to that of the fourth period is performed, and the ErrOut signal of the circuit S2 becomes "1" by capturing the value of the ErrOut signal in the circuit S1 of the fifth period, and all of the ErrOut signals of other circuits S1, S3 and S4 become "0"

By repeating the above-described process, the circuit shown in FIG. 5 sequentially shifts the value of the ErrOut signal and calculating the number of cycles from when the Srst signal becomes "1" until when the value "1" of the ErrOut signal is detected, the circuit in which the malfunction occurs may be specified. In this embodiment, since the ErrOut signal becomes "1" in the fourth period, it is understood that the setup violation occurs in the circuit 52. Meanwhile, if a plurality of points are failed, they may be detected in a similar manner.

Next, in a seventh period, by switching the SM signal to the normal mode "1" and asserting the Srst signal to "1" at the same time, the registers R2 of the particular circuits S1 to S4 are allowed to restore the value before staring the scan mode operation (automatically judged by the circuit configuration shown in FIG. 4). However, the values of each of the registers R1 of the circuits S1 to S4 are such that the register R1 of the circuit S2 has the value of malfunction since the clock signal Clk is negated during the SM signal is "1" or the Srst signal is "0", so that a recovery method to be described in a following embodiment is performed if necessary and the operation is restarted.

As described above, in the semiconductor circuit according to this embodiment, it is possible to specify the circuit in which the malfunction of the setup violation occurs, by providing the means for scanning the register R2.

Meanwhile, the circuit shown in FIG. 4 is targeted to a timing critical register (endpoint of a critical path) in a synchronous design section, so that this is applicable to entire digital design field such as a SOC (System On a Chip) and a microcomputer. Also, this is the same for a circuit according to the embodiment to be described below.

Figure 7:
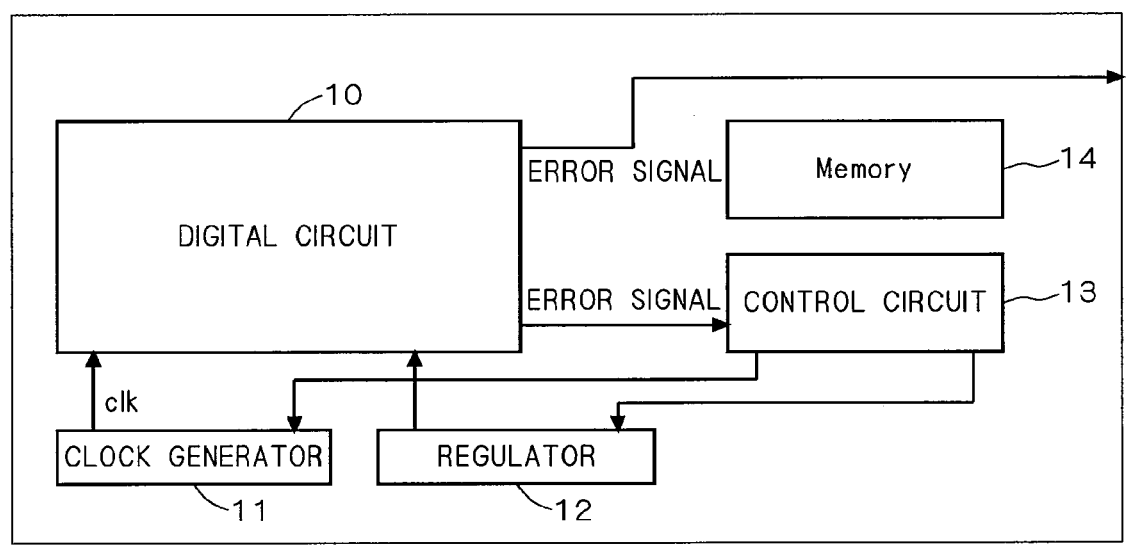
FIG. 7 is a block diagram of a semiconductor device according to the first embodiment of the present invention.

Specifically, a block diagram of a case to which the semiconductor device according to this embodiment is applied is shown in FIG. 7. The semiconductor device shown in FIG. 7 is provided with a digital circuit 10 to which the malfunction judging circuit and the logic circuit (logic stage) shown in FIG. 4 are applied, a clock generator 11 for supplying the clock signal Clk to the digital circuit 10, and a regulator 12 for supplying a voltage to the digital circuit 10. Further, the semiconductor device shown in FIG. 7 is provided with a control circuit 13 for controlling the clock generator 11 and the regulator 12 based on the error signal from the digital circuit 10, and a memory 14 to which the digital circuit 10 appropriately refers. Meanwhile, the control circuit 13 also includes an error rate calculation process.

Further, in the semiconductor device shown in FIG. 7, the error signal to the control circuit 13 is asserted, so that the control circuit 13 controls the clock generator 11 and the regulator 12, thereby reducing the power consumption. Also, in the semiconductor device shown in FIG. 7, when the malfunction such as the setup violation occurs, by switching the scan mode to transmit the error signal to output to outside, a point (circuit) at which the malfunction occurs may be specified. In addition, in the semiconductor device adopting the circuit shown in FIG. 4, it is possible to restart from a condition stopped in the scan mode, after recovery of the point (circuit) at which the malfunction occurs.

Second Embodiment

Figure 8:
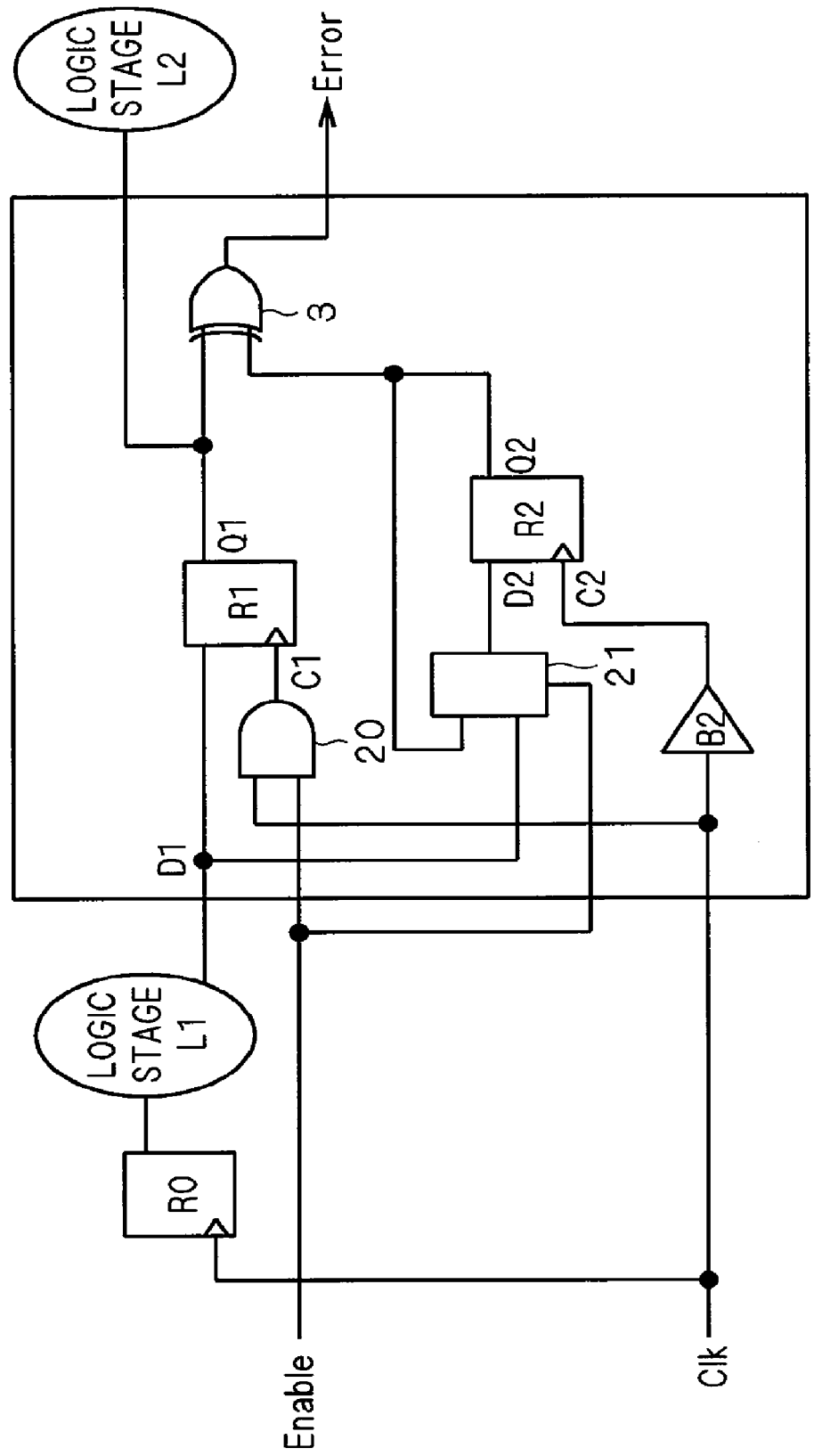
FIG. 8 is a circuit diagram being a premise of a malfunction judging circuit according to a second embodiment of the present invention.

A circuit shown in FIG. 8 makes a path from a register R0 through the logic stage L1 to the register R1 a critical path and transmits the data signal Q1 output from the register R1 to a logic of a subsequent stage (logic stage L2). Herein, in the circuit shown in FIG. 8, the clock signal C1 to be supplied to the register R1 is not the clock signal Clk directly supplied from outside but a gated clock signal obtained by figuring out a logical sum with an Enable signal in an AND circuit 20, which serves as the clock control means. Meanwhile, the clock control means is not limited to the AND circuit and any circuit provided with an equivalent function may be used.

Also, in the circuit shown in FIG. 8, the register R2 in which the setup violation condition is eased by inserting a buffer B2 into the clock line is provided, and the comparator 3 compares the output result of the same with that of the register R1. Further, in the circuit shown in FIG. 8, when the Enable signal is "0", the data signal Q2 output from the register R2 is fed back by using a selection circuit 21 so as not to capture the data from the register R0, and when the Enable signal is "1", the data signal D1 is captured.

However, in the circuit shown in FIG. 8, a clock signal C2 input to the register R2 on an expectation value side is not the gated clock signal but free-running. Therefore, in the register R2, a clock event always occurs, thereby reducing a power consumption reducing effect by driving the register R1 by the gated clock signal.

Figure 9:
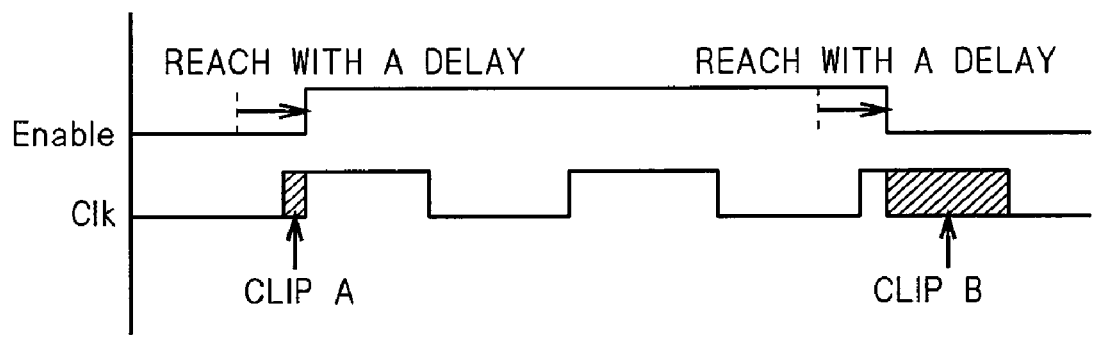
FIG. 9 is a schematic diagram for illustrating a clip of the clock signal.

Also, in the normal circuit operation, the Enable signal is not changed in an advantageous period (in a case of positive edge, "H" period) such that a waveform of the clock signal is not clipped. However, when the Enable signal reaches with delay (what is called the setup violation of the Enable signal) due to a reduction in a supply voltage and a change in the surrounding temperature, the clock signal is clipped, and this results in an induction of the malfunction by affecting the signal transmission to the subsequent stage. FIG. 9 schematically shows a condition in which the clock signal is clipped.

Figure 10:
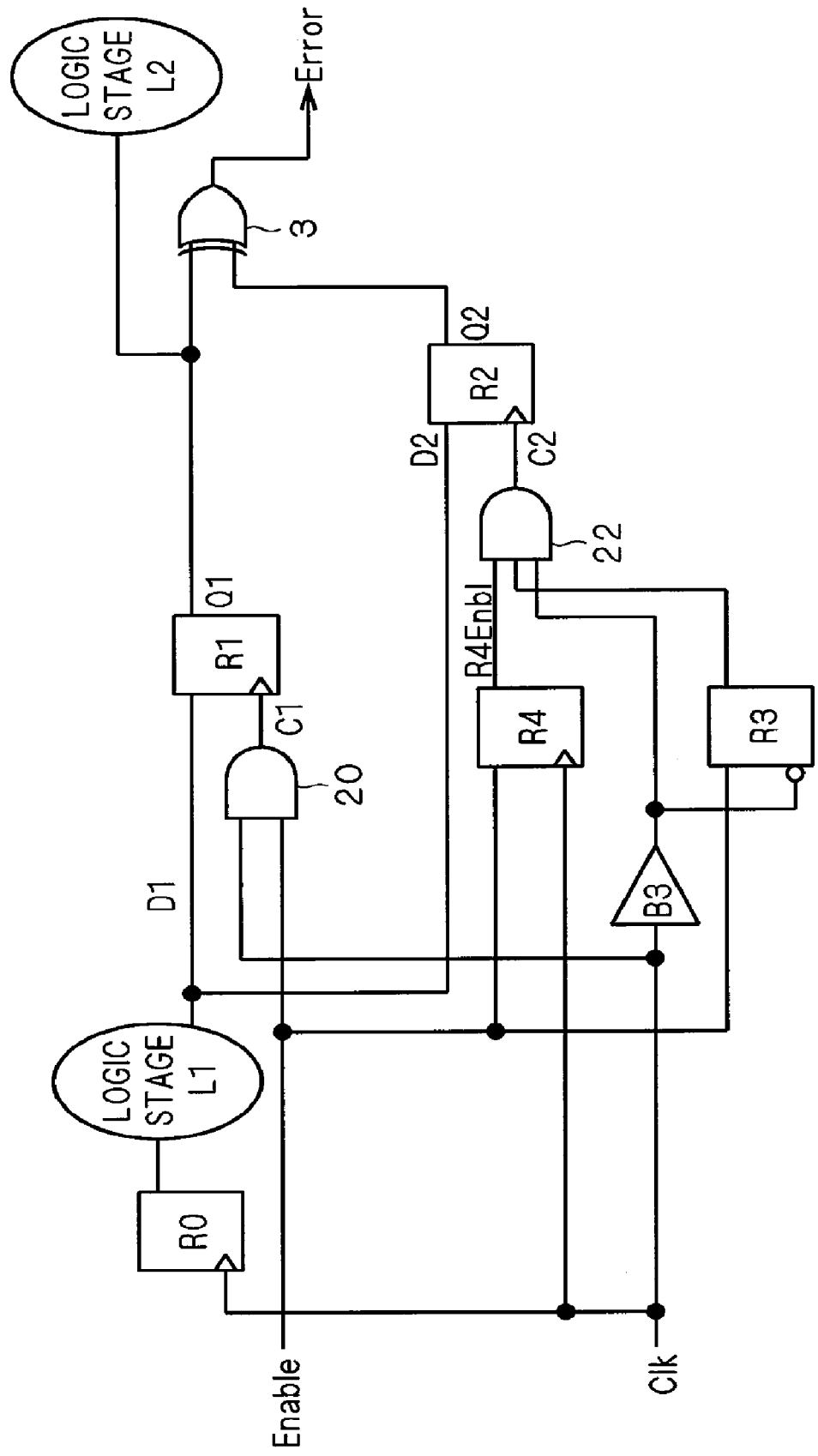
FIG. 10 is a circuit diagram of the malfunction judging circuit according to the second embodiment of the present invention.

Then, in the semiconductor device according to this embodiment, the power consumption reducing effect is improved by using the circuit shown in FIG. 10, and the setup violation of the Enable signal is detectable. In a circuit shown in FIG. 10, in order to make the clock signal input to the register R2 the gated clock signal, an AND circuit 22 is provided as the clock control means. Meanwhile, the clock control means is not limited to the AND circuit, and any circuit provided with the equivalent function may be used.

To the AND circuit 22, the output from a register R3, which serves as a lock-up latch, the output from a register R4, and the clock signal delayed by the buffer B3 are input. Also, to the register R3, the Enable signal and the clock signal delayed by the buffer B3 are input. To the register R4, the Enable signal and the clock signal are input. Other configuration of the circuit shown in FIG. 10 is the same as the circuit configuration shown in FIG. 8, so that the same reference numeral is assigned to the same component and the detailed description thereof is omitted.

Herein, regarding the delay of a rise event of the Enable signal as a clip A shown in FIG. 9, when the Enable signal at the time of the rising of the original clock signal is "L", this is detectable by negating the clock signal to the register R2. That is to say, if the Enable signal becomes "H" after a judging time of the clip and the clipped clock signal is generated in the register R1, the contents of the register R1 change and the difference occurs between the same and the register R2, so that the error signal rises. Meanwhile, when the contents of the register R1 do not change, the data transmission to the subsequent stage does not occur, so that it is not required to raise the error signal.

Next, regarding the delay of a fall event of the Enable signal as a clip B shown in FIG. 9, as shown in FIG. 10, this is detectable by inserting the register R3 of the lock-up latch, which passes the event only during a disenable period of the clock signal delayed by the buffer B3 (delayed clock signal). That is to say, when the Enable signal is negated between the rising of the clock signal and the rising of the delayed clock signal, the clock signal input to the register R2 is negated. Therefore, if the contents of the register R1 change, the difference occurs between the same and the register R2 and the error signal rises. Meanwhile, when the contents of the register R1 do not change, the data transmission to the subsequent stage does not occur, so that it is not required to raise the error signal.

In a circuit shown in FIG. 10, the register R2 in which the positive-slack in the timing is left by inserting the buffer B3 into the clock line, as opposed to the register R1 of an actual operation. Then, the gated clock signal is input through the AND circuits 20 and 22 to the registers R1 and R2, respectively. Herein, in the circuit shown in FIG. 10, the register R3 of the lock-up latch is inserted before the AND circuit 22 as a fail safe circuit in order to block the event in the "H" period of the delay clock signal for preventing a glitch.

Further, in the circuit shown in FIG. 10, the register R4 is inserted and the output thereof is connected to the input of the AND circuit 22 for judging whether the event contents of the Enable signal are the rise event or the fall event. Also, in the circuit shown in FIG. 10, the setup violation of the data signal is detected (event detection from the clock signal C1 to the clock signal C2), and at the same time, the setup violation of the enable signal may also be detected.

Next, the operation of the circuit shown in FIG. 10 is described using a timing chart shown in FIG. 11. First, the signal input to a clock pin of the register R1 is made the clock signal C1, the signal input to a data input pin is made the data signal D1, and the signal output from a data output pin is made the data signal Q1. Also, the signal input to the clock pin of the register R2 is made the clock signal C2, the signal input to the data input pin is made a data signal D2, and the signal output from the data output pin is made the data signal Q2. Further, the error signal is output from the comparator 3 for comparing the data signals Q1 and Q2. Meanwhile, as described above, in the clock signal C2, the event transmits with delay by an amount of buffer inserted by the buffer B3, as opposed to the clock signal C1.

First, in a first period shown in FIG. 11, since the rise event of the Enable signal reaches with a delay, the clock signal C1 is clipped (hatched portion). Then, at the time of the rise event of the clock signal C1, the Enable signal is "L", so that an output R4Enbl of the register R4 becomes "L", although not shown. Therefore, in the first period, the clock signal C2 to the register R2 is negated, so that when the contents of the data change in the register R1, the result of the register R1 and that of the register R2 differ to each other, and the error signal becomes "1". That is to say, the circuit shown in FIG. 10 may detect the setup violation of the Enable signal. If the contents of the data do not change in the register R1, the error signal does not become "1" and the clip of the clock signal C1 is not detected, however, since the event itself does not occur and there is not an effect to a circuit of the subsequent stage, it is not required to assert this phenomenon.

Next, in a second period shown in FIG. 11, the Enable signal is determined to "H" before the rise event of the clock signals C1 and C2, however, the arrival of the data event to the register R1 (change of the data signal D1) is not in time for the rise event of the clock signal C1. Therefore, the results of the data signals Q1 and Q2 are different from each other and the error signal becomes "H". That is to say, the circuit shown in FIG. 10 may detect the setup violation of the data signal.

Next, in a third period shown in FIG. 11, the fall event of the Enable signal reaches with a delay, the clock signal C1 is clipped (hatched portion). Then, at the time of rise event of the clock signal C1, the Enable signal is "H", so that the output R4Enbl of the register R4 also is "H", although not shown. Therefore, in the third period, the Enable signal falls to "L" before the rise event of the clock signal C2, and the event is transmitted to the AND circuit 22 through the register R3, which is the lock-up latch, as a result, the clock signal C2 to the register R2 is negated. Further, when the contents of the data change in the register R1, the results of the registers R1 and R2 are different to each other, and the error signal becomes "1". That is to say, the circuit shown in FIG. 10 may detect the setup violation of the Enable signal. If the contents of the data do not change in the register R1, the error signal does not become "1" and the clip of the clock signal C1 may not be detected, however, since the event itself does not occur and there is not an effect to the circuit in the subsequent stage, it is not necessary to assert this phenomenon.

Next, in a fourth period shown in FIG. 11, since the Enable signal is "L", the clock signals C1 and C2 are negated together, so that this does not affect the output result of the circuit shown in FIG. 10. Also, in a fifth period shown in FIG. 11, the same operation as that in the second period is performed, so that the detailed description thereof is omitted.

As described above, the semiconductor device according to this embodiment uses the circuit shown in FIG. 10, so that it is possible to improve the power consumption reduction effect and detect the setup violation of the Enable signal.

Third Embodiment

In the second embodiment, it is possible to detect the setup violation of the data signal and the setup violation of the Enable signal, respectively; however, in a case in which the setup violation of the data signal and that of the Enable signal occur in the same period, it has not been possible to detect the setup violation. Therefore, in this embodiment, the setup violation of the data signal and that of the Enable signal generated in the same period may be detected by using the circuit shown in FIG. 12.

In general, the Enable signal is often used to control a bus (a plurality of bits), so that in the circuit shown in FIG. 12, a circuit for detecting only the Enable signal is newly added to a circuit group in which the setup violation of the Enable signal is controlled by the same Enable signal. That is to say, the circuit shown in FIG. 12 is composed of circuits A1 to A3 provided with the registers R1 and R2 and the comparator 3 for detecting the setup violation of the data signal, and a circuit B for detecting the setup violation of the Enable signal commonly supplied to the circuits A1 to A3.

The circuits A1 to A3 shown in FIG. 12 are obtained by removing the registers R3 and R4 from the circuit shown in FIG. 10. On the other hand, the circuit B shown in FIG. 12 is provided with the register R3 to which the clock signal and the Enable signal are input, the register R4 to which the clock signal and the Enable signal delayed by the buffer 30 are input, and a comparator 31 for comparing an output of the register R3 and an output of the register R4. Meanwhile, the configuration of the circuit B is not limited to the circuit configuration shown in FIG. 12, and any circuit configuration having the equivalent function may be used.

Herein, the delay amount of the buffer B3 of the circuits A1 to A3 and that of the buffer 30 of the circuit B depend on slack in the previous stage logic of the target register, and the optimal delay amounts are set, respectively. Specifically, when the slack of the route from the Enable signal to each of the registers R1, R2, R3 and R4 is larger than the slack of the logic stage L1, the delay amount of the buffer B3 inserted to the previous stage of the register R2 becomes larger than the delay amount of the buffer 30 inserted to the previous stage of the register R4.

Also, in the circuit shown in FIG. 12, since the circuit group controlled by the same Enable signal is three bits, one circuit B is provided for three circuits A1 to A3, however, the present invention is not limited to this. For example, if the circuit group controlled by the same Enable signal is five bits, one circuit B is provided for five circuits A1 to A5.

Next, the operation of the circuit shown in FIG. 12 is described using a timing chart shown in FIG. 13. First, the signal input to the clock pin of the register R1 is made the clock signal C1, the signal input to the data input pin is made the data signal D1, and the signal output from the data output pin is made the data signal Q1. Also, the signal input to the clock pin of the register R2 is made the clock signal C2, the signal input to the data input pin is made the data signal D2, and the signal output from the data output pin is made the data signal Q2.

Also, a signal input to the clock pin of the register R3 is made a clock signal C3, a signal input to the data input pin is made the data signal D3, and the signal output from the data output pin is made a data signal Q3. Also, a signal input to the clock pin of the register R4 is made a clock signal C4, a signal input to the data input pin is made a data signal D4, and a signal output from the data output pin is made a data signal Q4. Further, an error signal output from the comparator 3 for comparing the data signals Q1 and Q2 is made Error 1, and an error signal output from the comparator 31 for comparing the data signals Q3 and Q4 is made Error 2. Meanwhile, as described above, the clock signal C2 transmits the event with a delay by an amount of the insertion buffer relative to the clock signal C1 by the buffer B3, and the clock signal C4 transmits the event with a delay by an amount of the insertion buffer relative to the clock signal C3 by the buffer 30.

First, in a first period shown in FIG. 13, since the rise event of the Enable signal reaches with a delay, the clock signal C1 is clipped (hatched portion). In the circuit shown in FIG. 12, since the circuit for detecting the setup violation of the data signal and that for detecting the setup violation of the Enable signal are separated, it becomes impossible to detect the clip of the clock signal C1 as the Error 1 signal, which is the error detection signal of the data signal. However, in the first period shown in FIG. 13, the Error 2 signal, which is the error detection signal of the Enable signal becomes "H" and detects the clip of the clock signal C1.

Next, in a second period shown in FIG. 13, the setup violation of the data signal occurs, so that this is detected as the Error 1 signal. Meanwhile, in the second period, the Error 2 signal, which is the error detection signal of the Enable signal is still "L" and is not asserted.

Next, in a third period shown in FIG. 13, since the fall event of the Enable signal reaches with a delay, the clock signal C1 is clipped (hatched portion). The setup violation of the Enable signal by the clip of the clock signal C1 also is detectable, as the Error 2 signal becomes "H" as in the first period.

Next, in a fourth period shown in FIG. 13, since the Enable signal is "L", the clock signals C1 and C2 are negated, so that this does not affect the output result of the circuit shown in FIG. 12.

Next, in a fifth period shown in FIG. 13, the setup violation occurs in both of the data signal and the Enable signal. In the case of the fifth period, the data signal and the Enable signal are in a competitive relationship. That is to say, since the event of the data signal reaches with a delay relative to the rising of the clock signal Clk, this should normally be the setup violation, however, by the clip of the clock signal C1, the event of the data signal reaches at the time of the rising of the clock signal C1. Therefore, the result of the data signals Q1 and Q2 are the same, and the Error 1 signal, which is the error detection signal for the data signal, does not become "H", so that the setup violation of the data signal may not be detected. However, in the fifth period shown in FIG. 13, the Error 2 signal, which is the error detection signal for the Enable signal, becomes "H", so that the clip of the clock signal C1 may be detected. Meanwhile, when the event of the data signal reaches with a delay relative to the time of the rising of the clock signal C1, the setup violation of the data signal may also be detected.

As described above, in the semiconductor device according to this embodiment, by using the circuit shown in FIG. 12, even when the setup violation of the data signal and the setup violation of the Enable signal occur in the same period, at least one of them may be detected.

Fourth Embodiment

Figure 14:
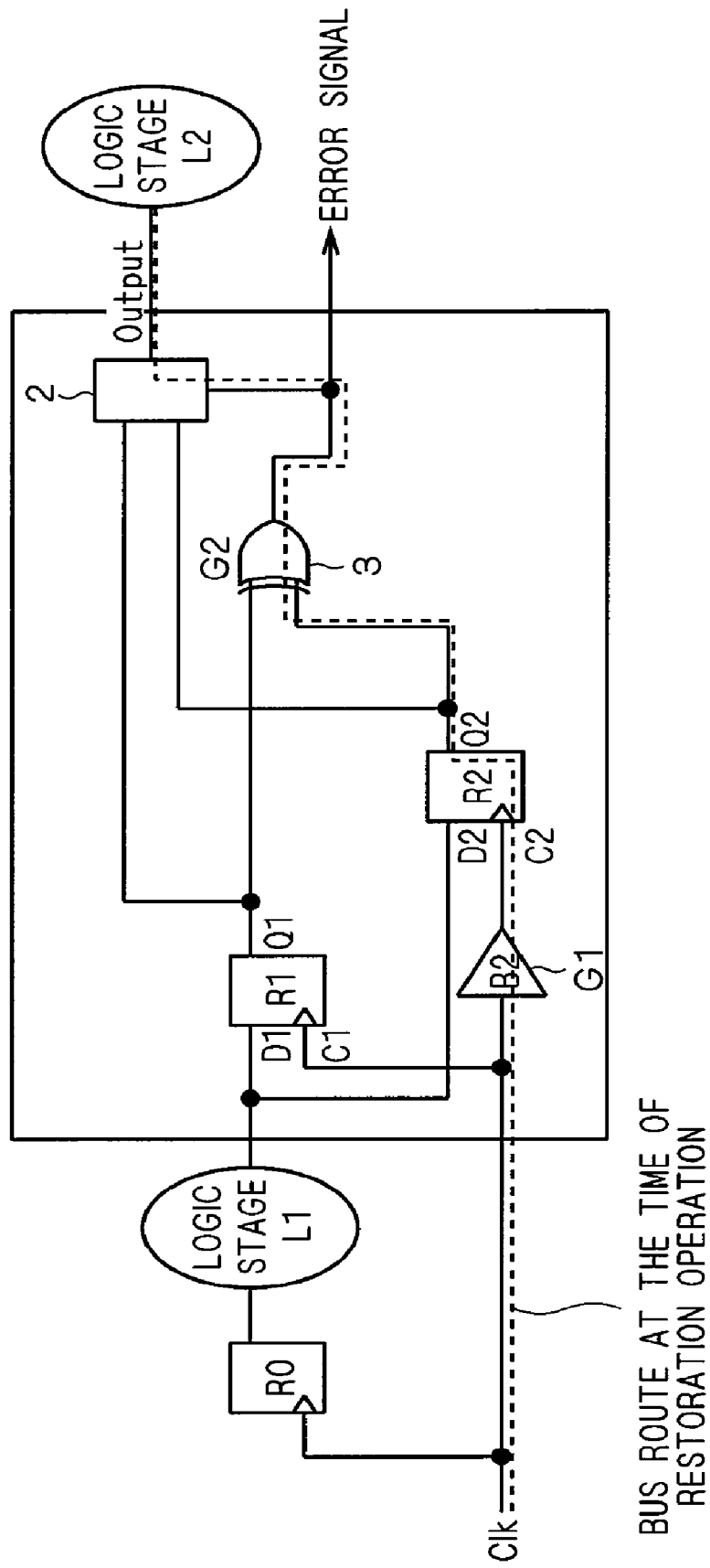
FIG. 14 is a circuit diagram being a premise of a malfunction judging circuit according to a fourth embodiment of the present invention.

In the circuit shown in FIG. 14, the register R2 in which the positive-slack in the timing is left by inserting the buffer B2, which is delay means, into the clock line, as opposed to the register R1, which is an actual operation register. In addition, the data signal D1, which is the output from the logic stage L1, is input to the register R1. The register R0 is connected to the previous stage of the logic stage L1. On the other hand, the data signal Q1, which is the output from the register R1 is input to the comparator 3.

The comparator 3 compares the data signal Q1 of the register R1 with the data signal Q2, which is the output of the register R2, and when the both signals are not conform to each other, outputs the error signal. Therefore, the circuit shown in FIG. 14 may actively detect the setup violation of the register R1 by an amount of delay of the buffer B2 inserted into the clock line. Also, in the circuit shown in FIG. 14, the selection circuit 2 is provided in the previous stage of the logic stage L2 of the subsequent stage. The selection circuit 2 switch controls to output the data signal Q1 from the register R1 to the logic stage L2 when the error signal, which is the output from the comparator 3, is "0", and to output the data signal Q2 from the register R2 to the logic stage L2 when the error signal is "1".

In addition, a normal path of the circuit shown in FIG. 14 is such that the data signal D1, which reaches the register R1, is captured in synchronization with the rising edge of the clock signal C1 and is transmitted to the logic stage L2 of the subsequent stage through the selection circuit 2. That is to say, the path route at the time of normal operation is the route through the register R1 and the selection circuit 2.

However, when the circuit shown in FIG. 14 detects the malfunction and performs a restoration operation, the data signal D2, which reaches the register R2 simultaneously with the data signal D1, is captured by the register R2 based on the clock signal C2, which reaches with a delay relative to the clock signal C1 by the buffer B2, which is the delay means. Then, the data signal D2 captured by the register R2 is output as the data signal Q2, and is transmitted to the logic stage L2 of the subsequent stage through the comparator 3 and the selection circuit 2. Therefore, when the malfunction is detected and the restoration operation is performed, the route indicated by a broken line in FIG. 14 becomes the path route at the time of restoration operation, and a sum of a delay amount G1 of the buffer B2 and a delay amount G2 in the comparator 3 is timing overhead for the path route at the time of normal operation. Therefore, in a case in which the subsequent stage is timing critical, the malfunction of the subsequent stage path could be induced by the sum of the delay amounts G1 and G2 of the path route at the time or restoration operation.

Figure 15:
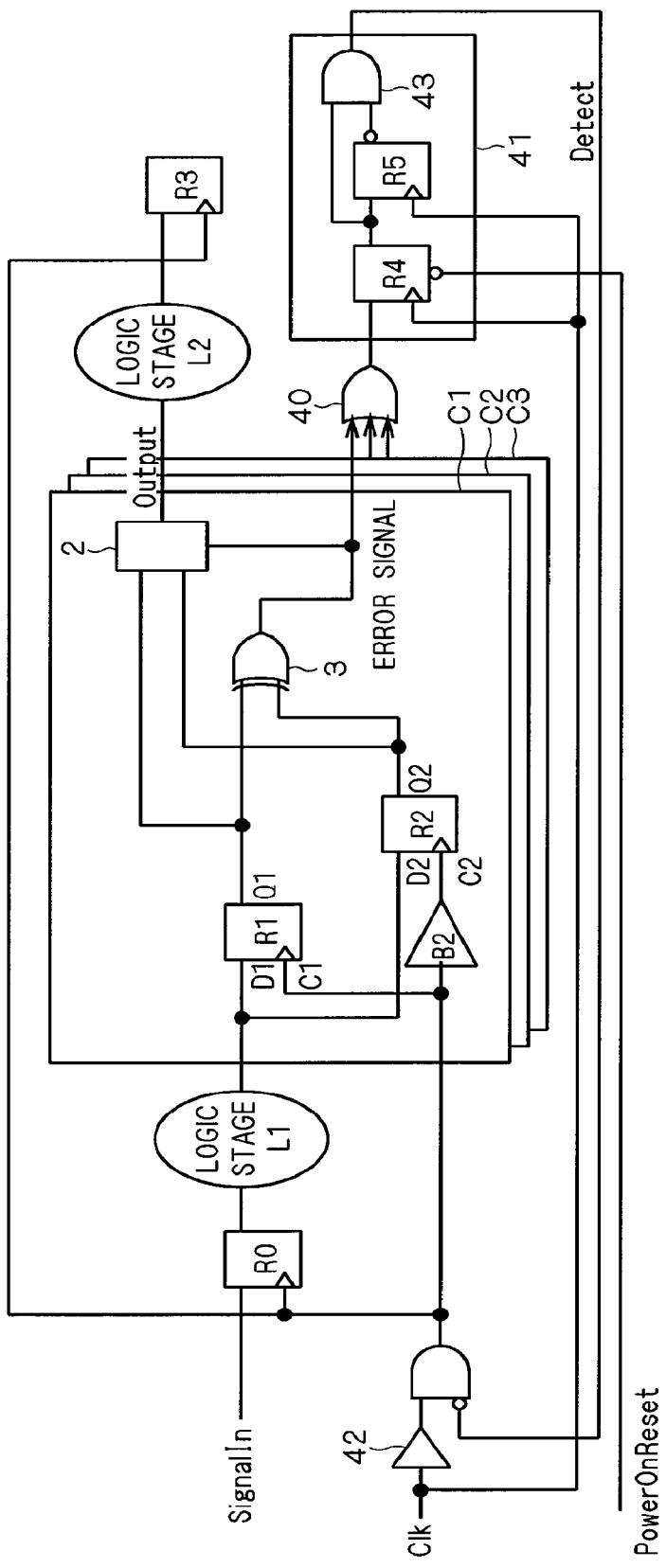
FIG. 15 is a circuit diagram of the malfunction judging circuit according to the fourth embodiment of the present invention.

Therefore, the semiconductor device according to this embodiment reduces a possibility to induce the malfunction of the subsequent path by using a circuit shown in FIG. 15. In the circuit shown in FIG. 15, a path from the register R0 through the logic stage L1 to the register R1 forms the critical path, and the data signal Q1 is output from the output pin of the register R1 and is transmitted to the logic of the subsequent stage (logic stage L2 and register R3). Also, in the circuit shown in FIG. 15, the register R2 in which the setup violation condition is eased by inserting the buffer B2 into the clock line is provided, and the comparator 3 for comparing the output of the register R1 and the output of the register R2 is provided.

Further, in the circuit shown in FIG. 15, the selection circuit 2 is inserted into the subsequent stage of the registers R1 and R2. Then, the selection circuit 2 is controlled to output the data signal Q1 when the error signal, which is the output from the comparator 3, is "0", and to output the data signal Q2 when the error signal is "1", thereby switching the event transmission to the logic stage L2.

Also, in the circuit shown in FIG. 15, a plurality of circuits C1 to C3 including the registers R1 and R2 and the like are provided (three circuits in FIG. 15), and the error signals from each circuit is bound at an OR circuit 40. Therefore, if the error signal is asserted ("H") in any of each of the circuits C1 to C3, the output from the OR circuit 40 becomes "H". Further, in the circuit shown in FIG. 15, the rising event of the OR circuit 40 is detected as a Detect signal in a differentiation circuit 41, and an AND circuit 42 negates the clock signal Clk to be supplied to each of the circuits C1 to C3 based on the Detect signal. Meanwhile, the cycle to negate the clock signal Clk may be set to an optional cycle (normally, one cycle) by a down counter, or set by a control signal from the system.

Herein, the differentiation circuit 41 is provided with the registers R4 and R5 and an AND circuit 43. An output from the OR circuit 40, the clock signal Clk, and a Power On Reset signal from the system are input to the register R4. The output from the register R4 and the clock signal Clk are input to the register R5. The output from the register R4 and an inverted output from the register R5 are input to the AND circuit 43 to output the Detect signal.

The circuit shown in FIG. 15 detects the assert of the error signal, and disenables the clock signal Clk of the targeted circuit to perform the malfunction restoration process during the period in which the clock signal is disenabled. Further, when the circuit shown in FIG. 15 detects the signal level of the error signal, the clock signal after being disenabled is not recovered, so that the differentiation circuit 41 is provided for detecting not the signal level but the edge. Also, in the circuit shown in FIG. 15, the differentiation circuit 41 filters so as not to pick up the glitch (minute signal due to a clock phase difference) of the error signal. Meanwhile, although not shown in the circuit shown in FIG. 15, the malfunction restoration cycle is limited by a counter so as to be a predetermined number of cycles, or the disenable period of the clock signal is controlled by supplying the control signal from the system (Req) to the AND circuit 42.

Figure 16:
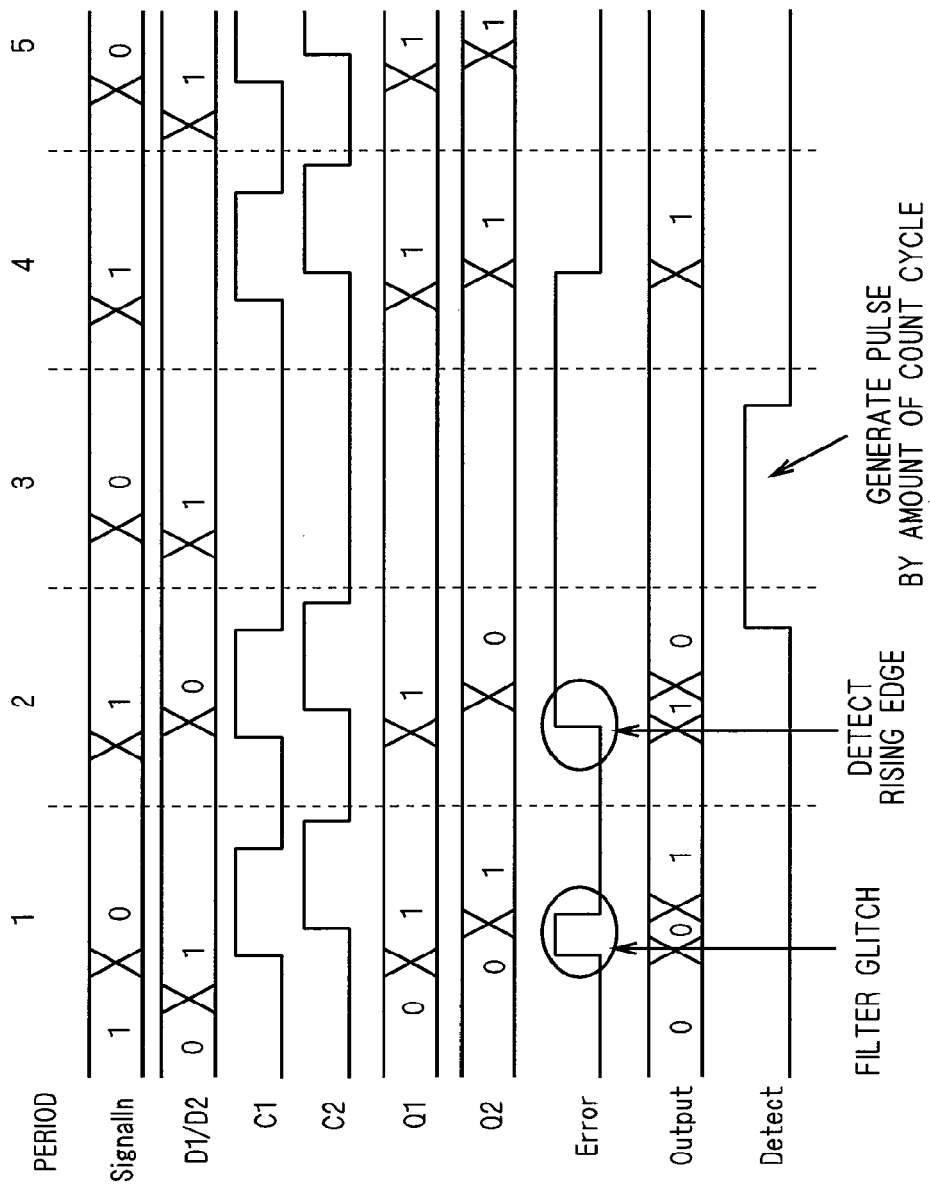
FIG. 16 is a timing chart of the malfunction judging circuit according to the fourth embodiment of the present invention.

Next, the operation of the circuit shown in FIG. 15 is described using a timing chart shown in FIG. 16. First, the signal input to the clock pin of the register R1 is made the clock signal C1, the signal input to the data input pin is made the data signal D1, and the signal output from the data output pin is made the data signal Q1. Also, the signal input to the clock pin of the register R2 is made the clock signal C2, the signal input to the data input pin is made the data signal D2, and the signal output from the data output pin is made the data signal Q2. Meanwhile, as described above, in the clock signal C2, the event is transmitted with a delay by the amount of insertion buffer, relative to the clock signal C1, by the buffer B2. In addition, the data signal D1 captures a value of a SignalIn signal on the rising edge of the clock signal C1, and the event reaches through the delay of the logic stage L1. In the same manner, the data signal D2 captures the value of the SignalIn signal on the rising edge of the clock signal C2, and the event reaches through the delay of the logic stage L1.

First, in the first period shown in FIG. 16, each of the rise events of the data signals D1 and D2 is performed before the rise event of the clock signals C1 and C2, so that the registers R1 and R2 capture the logic "1" normally. However, the error signal becomes "1" due to the phase difference between the clock signals C1 and C2, thereby the output signal of this period also becomes the value of the data signal Q2. After that, the error signal returns to "0", thereby the Output signal switches to the value of the data signal Q1, and normally operates. However, the differentiation circuit 41 shown in FIG. 15 filters a glitch pulse less than a half period and does not assert the Detect signal. Therefore, the clock signals C1 and C2 in the second period, which is the subsequent cycle, are not disenabled.

Next, in the second period shown in FIG. 16, since the arrival of the fall event of the data signal D1 in the register R1 is not in time for the rise event of the clock signal C1, the data signal Q1 cannot capture "0". However, since the arrival of the fall event of the data signal D2 in the register R2 is in time for the rise event of the clock signal C2, the data signal Q2 can capture "0". Therefore, a difference occurs between the result of the register R1 and that of the register R2, and the result of the comparator 3 (error signal) becomes "1" (setup violation is detected).

At that time, the route of the selection circuit 2 switches to the route in which the data signal Q2 is made the Output signal, by the error signal, and the Output signal becomes "0". Herein, it is required to prevent the overhead for switching from the clock signal C1 to the clock signal C2 and from the data signal Q2 to the Output signal from inducing the setup violation of the subsequent stage. Therefore, the differentiation circuit 41 shown in FIG. 15 detects the rising edge of the error signal, confirms that this is not the glitch not larger than the half period, and generates a positive pulse of an amount of the counter cycle in the Detect signal. In this embodiment, it is set that a predetermined count value is 1, and generates the pulse from a trailing edge of the clock signal C1 to the trailing edge of the clock signal C1 of the third period, which is the subsequent cycle.

Meanwhile, in this embodiment, although the Detect signal is in synchronization with the trailing edge of the clock signal C1, in order to simplify the description, it may be configured such that the Detect signal is synthesized in synchronization with the clock, which is a little faster than the clock signal C1, thereby leaving the slack in the malfunction detection period. Specifically, since the clock, which is a little faster than the clock signal C1, is clock synthesized in a clock tree, logically, it is possible to provide an optional delay difference. Also, the circuit shown in FIG. 15 has the circuit configuration using not the trailing edge of the clock signal C1 but a little faster clock.

Next, in the third period shown in FIG. 16, the event of the register R0 obtained by triggering the event from the SignalIn signal of the previous cycle (second period) reaches the data signals D1 and D2. However, the events of the clock signals C1 and C2 are disenabled, and the values of the data signals D1 and D2 are not captured as the data signals Q1 and Q2. That is to say, the event of the Output signals does not occur. Therefore, the register R3 of the subsequent stage may capture the value of the Output signal during two cycles, which are the second and third periods, so that it is possible to sufficiently ensure the setup margin.

Meanwhile, if the event occurs in the SignalIn signal in this cycle (third period), since the clock signals C1 and C2 are disenabled, this event is not transmitted to the subsequent stage. However, by adopting fail safe means for performing a handshake between the control signal from the system (Req signal), which requires the logic circuit such as the logic stage L1 to transmit the data, and the Detect signal, the above problem may be solved. That is to say, it is only necessary to prevent the event from occurring in the SignalIn signal while the Detect signal is asserted, on the other hand, negate the Req signal while the data is not prepared for the SignalIn signal, using this means.

Next, in the fourth period shown in FIG. 16, the Detect signal is negated, and the rise event of the data signals D1 and D2 held while the clock signal Clk is disenabled reaches before the rise events of the clock signals C1 and C2. Therefore, the registers R1 and R2 may normally capture the logic "1".

As described above, the semiconductor device according to this embodiment reduces the possibility of inducing the malfunction of the path of the subsequent stage due to the delay amount of the path route at the time of the restoration operation, by using the circuit shown in FIG. 15.

Fifth Embodiment

Figure 17:
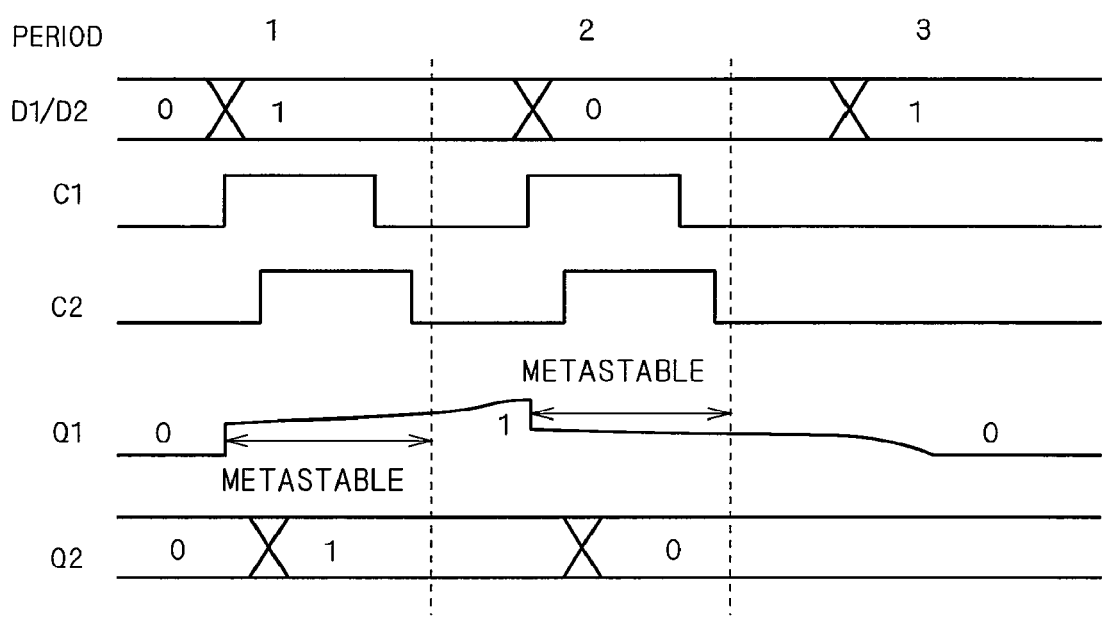
FIG. 17 is a schematic diagram for illustrating metastable.

When the circuit shown in FIG. 15 is driven by a regular voltage, a setup time is followed, however, when the delay increases with a decrease in a driving voltage, a metastable state in which the setup time is not followed and the output becomes unstable occurs. This is specifically described using a timing chart shown in FIG. 17. First, when driven by the regular voltage, at the rising of the clock signal C1 in the first period, the register R1 captures the event of the data signal D1. However, in the timing chart shown in FIG. 17, the data signal Q1, which is the output of the register R1, transits to an unstable state (metastable) from "0" to "1" with the decrease in the driving voltage. Similarly, at the rising of the clock signal C1 in the second period shown in FIG. 17, the data signal Q1, which is the output of the register R1, transits to the unstable state (metastable) from "1" to "0" with the decrease in the driving voltage.

Figure 18:
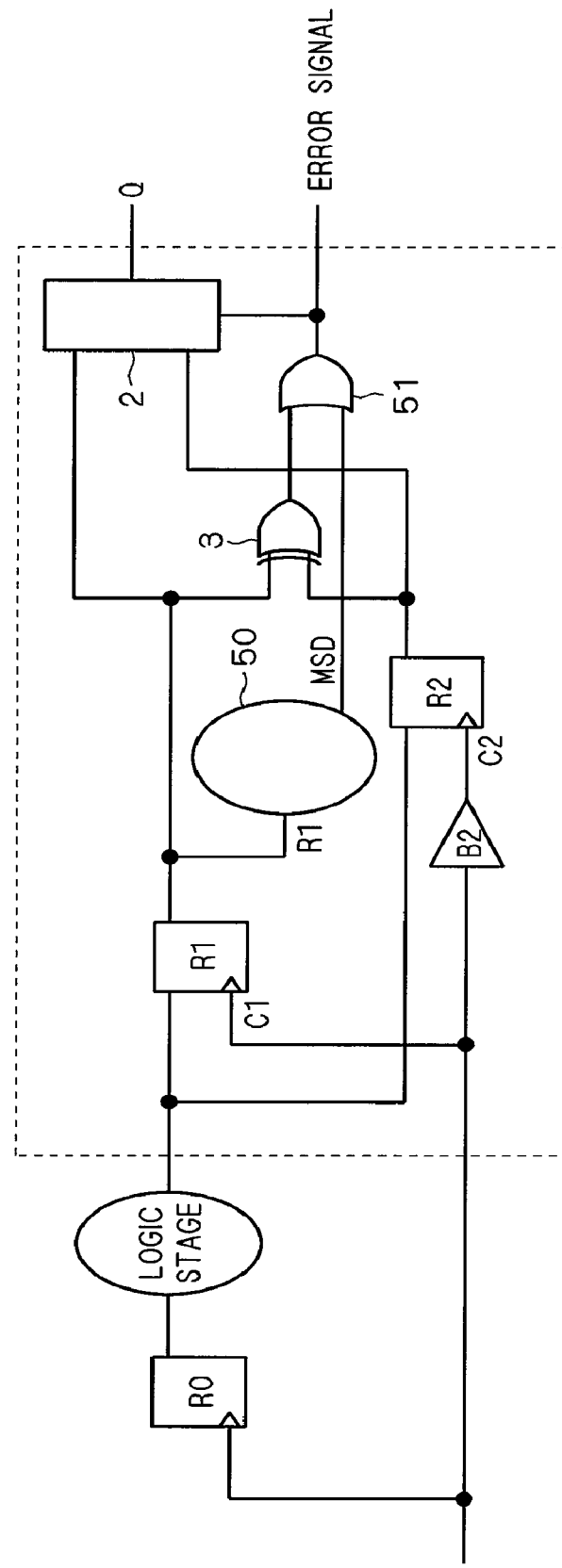
FIG. 18 is a circuit diagram of a malfunction judging circuit according to a fifth embodiment of the present invention.

Therefore, in the semiconductor device according to this embodiment, a circuit in which a metastability detection circuit 50 is provided for the output of the register R1 as shown in FIG. 18 is adopted. The circuit shown in FIG. 18 detects existence or nonexistence of occurrence of the metastable by the metastability detection circuit 50 to control such that the output of the circuit does not transit to the unstable state. That is to say, the metastability detection circuit 50 shown in FIG. 18 processes an MSD signal to be output and the output of the comparator 3 by an OR circuit 51 and makes the error signal to "H" regardless the output of the register R1 when detecting the metastable. In addition, the metastability detection circuit 50 controls such that the output of the register R2 is selected in the selection circuit 2.

In addition, the circuit diagram of the metastability detection circuit 50 is shown in FIG. 19. The metastability detection circuit 50 shown in FIG. 19 is provided with an inverter using a pair transistor of a PMOS (P-channel Metal-Oxide Semiconductor) 52 of a low threshold (Lvt) and an NMOS (N-channel Metal-Oxide Semiconductor) 53 of a high threshold (Hvt). Further, the metastability detection circuit 50 shown in FIG. 19 is provided with the inverter using the pair transistor of a high threshold PMOS 54 and a low threshold NMOS 55 to detect the metastable state by an XOR circuit 56 calculating XOR of both of the inverters.

Figure 20:
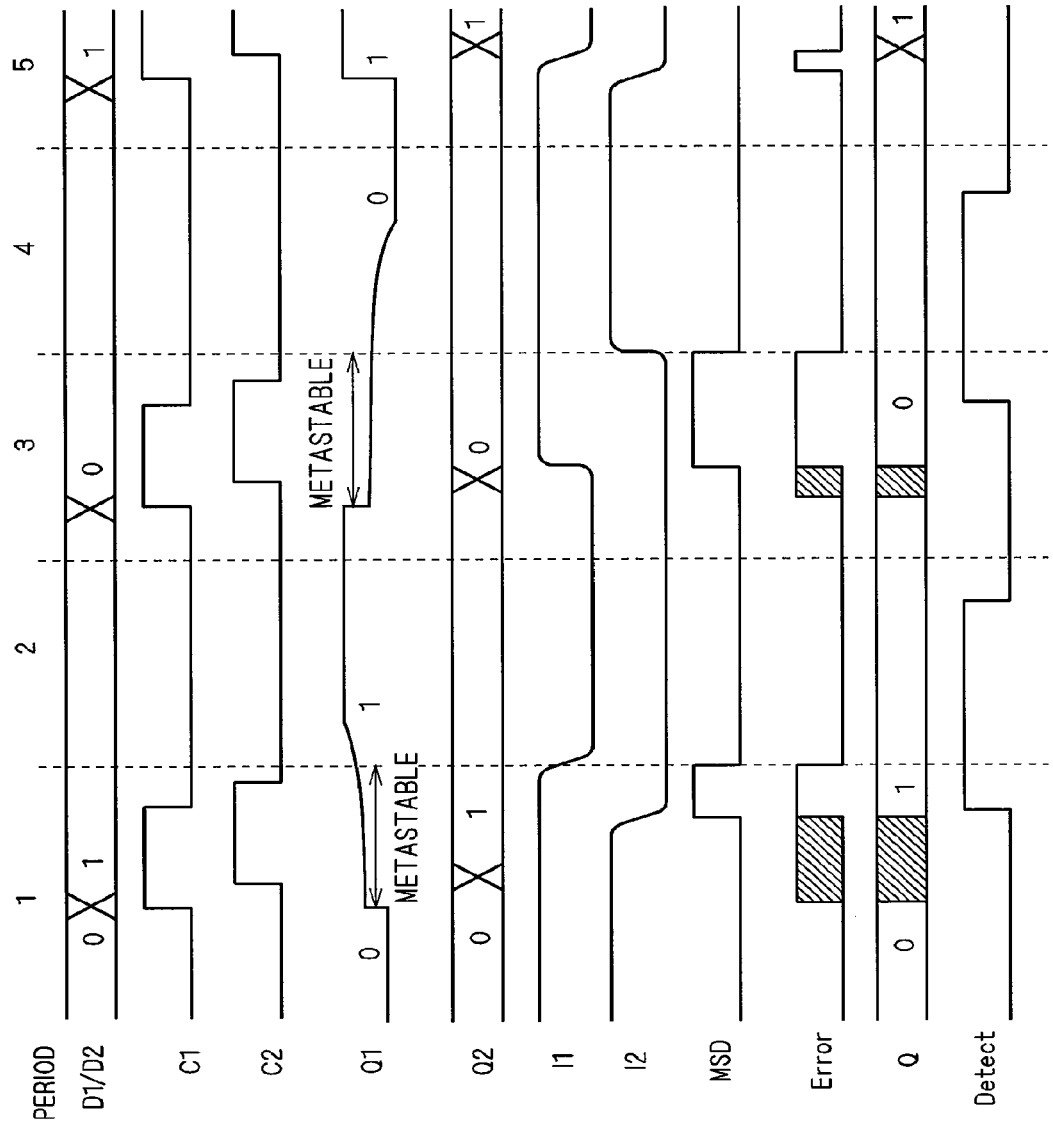
FIG. 20 is a timing chart of the malfunction judging circuit according to the fifth embodiment of the present invention.

Next, the operation of the circuit shown in FIGS. 18 and 19 is described using a timing chart shown in FIG. 20. Herein, an output I1 is an inverter output of the low threshold PMOS 52 and the high threshold NMOS 53, an output I2 is an inverter output of the high threshold PMOS 54 and the low threshold NMOS 55, and MSD is a result of XOR logic of the output I1 and the output I2. Also, although not shown in FIG. 18, the OR circuit 40 and the differentiation circuit 41 shown in FIG. 15 are provided as output destinations of the error signal to control the clock signals C1 and C2 based on the Detect signal, which is the output of the differentiation circuit 41.

First, in the first period shown in FIG. 20, the data signals D1 and D2 transit from "0" to "1" at the same time with the rising of the clock signal C1, however, due to the decrease in the driving voltage, the data signal Q1 is in the metastable state. Also, sensitivity of the transit output from "1" to "0" of the output I1 is worse than that of the output I2, so that the output I2 transits to "0" faster than the output I1, and the output I1 transits to "0" with a little delay. The MSD during the delay difference of the outputs I1 and I2 becomes "1" and the metastable may be detected. In response to the detection result (MSD="1") of the metastable, the error signal becomes "1", and further, the Detect signal becomes "1".

Next, in the second period shown in FIG. 20, in response to the Detect signal "1", the clock signals C1 and C2 are negated, and the result of the output Q is restored in this period.

Next, in the third period shown in FIG. 20, the data signals D1 and D2 transit from "1" to "0" at the same time with the rising of the clock signal C1, however, due to the decrease in the driving voltage, the data signal Q1 is in the metastable state. In this period, as opposed to the case of the first period, sensitivity of the transit output from "0" to "1" is worse in the output I2 than in the output I1, so that the output 1 transits to "1" faster than the output I2, and the output I2 transits to "1" with a little delay. The MSD during the delay difference of the outputs I1 and I2 becomes "1", and the metastable may be detected. In response to the detection result (MSD="1") of the metastable, the error signal becomes "1" and further, the Detect signal becomes "1".

Next, in the fourth period shown in FIG. 20, in response to the Detect signal "1", the clock signals C1 and C2 are negated, and the result of the output Q is restored in this period.

Next, in the fifth period shown in FIG. 20, since the data signals D1 and D2 transit from "0" to "1" before the rising of the clock signal C1, both of the data signals Q1 and Q2 may normally capture "1".

As described above, in the semiconductor device according to this embodiment, since the circuit shown in FIGS. 18 and 19 are adopted, the existence or nonexistence of the metastable occurrence may be detected and it may be controlled such that the output Q of the circuit does not transit to the unstable state. Meanwhile, although the circuit configuration provided with the differentiation circuit and the selection circuit 2 has been described in the malfunction judging circuit according to this embodiment, the present invention is not limited to this, and the configuration, which is not provided with the differentiation circuit and the selection circuit, and the configuration further provided with the circuit for detecting the setup violation of the Enable signal shown in FIG. 12 or the like may be used.

Sixth Embodiment

Figure 21:
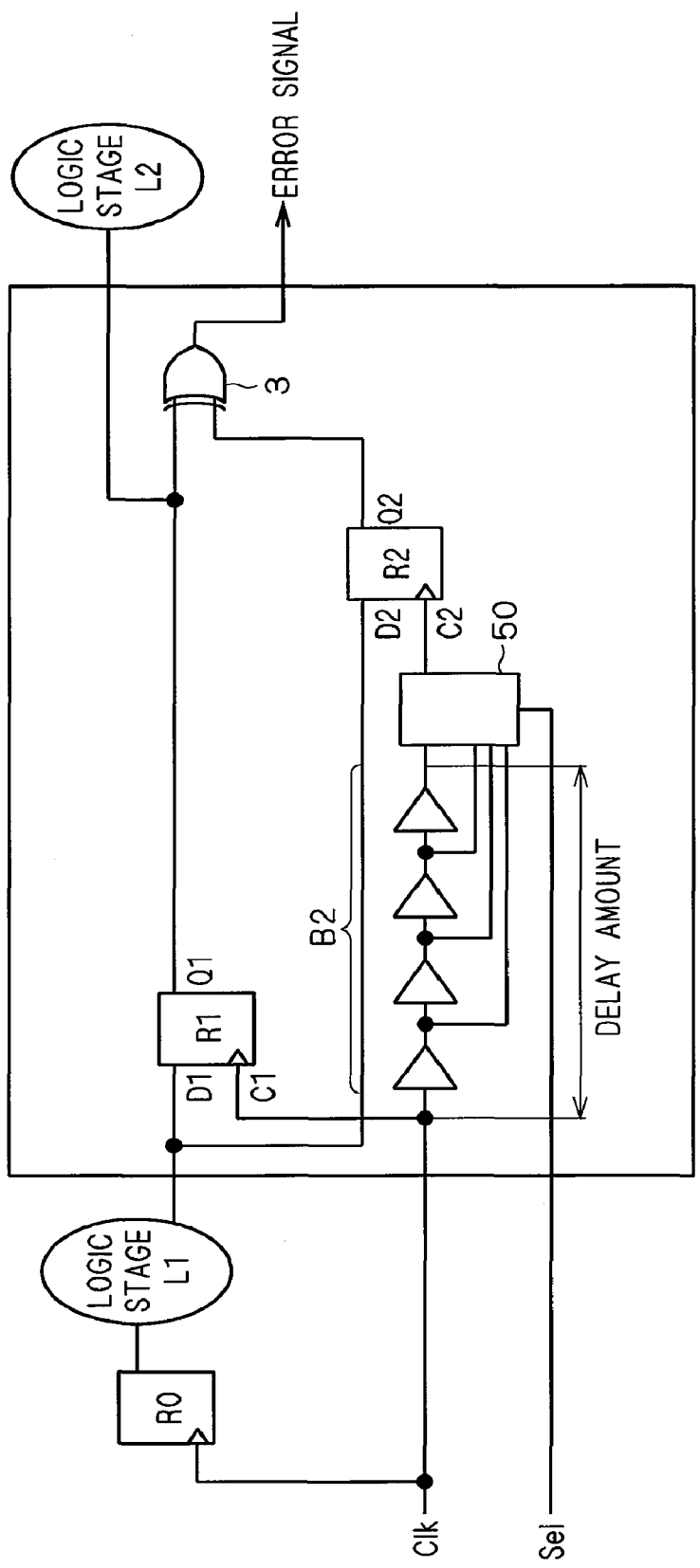
FIG. 21 is a circuit diagram being a premise of a malfunction judging circuit according to a sixth embodiment of the present invention.

The circuit shown in FIG. 21 is provided with the register R2 in which the positive-slack in the timing is left by the amount of the buffer chain B2, which is the delay means, inserted into the clock line, as opposed to the register R1, which is the actual operation register. Then, the data signal D1 output from the logic stage L1 is input to the register R1. The register R0 is connected to the previous stage of the logic stage L1. On the other hand, the data signal Q1 output from the register R1 is input to the logic stage L2 of the subsequent stage and is input to the comparator 3.

The comparator 3 compares the data signal Q1 output from the register R1 and the data signal Q2 output from the register R2, and when both of the signals are not conform to each other, outputs the error signal. Therefore, the circuit shown in FIG. 21 may actively detect the setup violation of the register R1 by the delay amount of the buffer chain B2 inserted into the clock line. Also, in the circuit shown in FIG. 21, a selection circuit 50 is provided for adjusting the delay amount of the buffer chain B2. This selection circuit 50 is driven based on a selection signal Sel input from outside. Then, the delay amount (Delay) of the buffer chain B2 included in the similar circuit (error detection FF) is uniformized to an optimal value in entire of the plurality of circuits. However, actually, there is a close relationship between the amount of delay to be inserted and a speed margin, and if the speed margin of the path is smaller, it is required to increase the amount of delay to be inserted. However, there is a problem that the amount of delay excessively inserted results in the overhead of the circuit size and the power consumption and that the hold resistance is weakened. On the other hand, with the too small amount of delay inserted, there is a problem that the area in which the expectation value register (R2) fails as the operation target register (R1), so that the malfunction detection spot becomes smaller.

Therefore, in this embodiment, the delay path is grouped by the speed margin and the optimal amount of delay is inserted into each group. FIG. 22 shows a graph representing the relationship between the slack corresponding to the speed margin and the number of paths. In the graph shown in FIG.

22, for example, four stages of buffers each having the delay amount of 0.5 ns are inserted for the slack from 0 to 1 represented on a transverse axis, three stages of buffers are inserted for the slack from 1 to 2, two stages of buffers are inserted for the slack from 2 to 3, and four stages of buffers are inserted for the slack from 3 to 4. Thereby, it is possible to suppress the overhead of the area and the power consumption while holding the operation margin.

Before specifically describing, the circuit (error detection FF) shown in FIG. 23A is symbolized as shown in FIG. 23B. The number after "B" in the center of FIG. 23B indicates the number of stages of the buffer B2 inserted into the clock line of the register R2 shown in FIG. 23A. For example, B-1 shown in FIG. 23B indicates that one stage of buffer is inserted. Meanwhile, in the circuit shown in FIG. 23A, the more the buffer amount, the larger the delay difference between the registers R1 and R2, and the margin for detecting the malfunction (detection margin) becomes larger, however, there is a problem that the circuit size increases, the power consumption increases, and a hold margin phenomenon occurs. Also, the circuit shown in FIG. 23A is substantially the same as the circuit configuration shown in FIG. 3, so that the detailed description is omitted.

Next, the circuit configuration when using four circuits (U1, U2, U3, U4) shown in FIG. 23A is shown in FIG. 24. Meanwhile, in FIG. 24, it is shown by using FIG. 23B, which symbolizes the circuit of FIG. 23A. Also, in the circuit configuration shown in FIG. 24, the previous stage (logic stage) having different logic amount is inserted into each of the circuits (U1, U2, U3, U4). Therefore, the speed margins (slacks) for frequencies of the circuits (U1, U2, U3, U4) are made 0 ns, 0.5 ns, 1.0 ns and 1.5 ns, respectively. Also, the delay amount for one stage of the buffer to be inserted is made 0.5 ns. Meanwhile, in the circuit configuration shown in FIG. 24, the buffer to be inserted into each of the circuits (U1, U2, U3, U4) is made one stage.

Next, the operation of the circuit configuration shown in FIG. 24 is described by using a timing chart shown in FIG. 25. In the timing chart shown in FIG. 25, it is supposed that the delay overhead of 0.5 ns is generated in a data terminal D of each of the circuits (U1, U2, U3, U4) by reducing the supply voltage as the period proceeds. Therefore, in the fourth period, the slack of 1.5 ns is reduced from the first period (delay of 1.5 ns is increased).

In the first period shown in FIG. 25, the setup violation of the circuit U1 is detected (setup violation does not occur in other circuits U2, U3 and U4). However, after a second period, even though the setup violation occurs in the circuit U1, the margin of the register R2, which is the phase difference of the clock signal C2 relative to the clock signal Clk, is insufficient, so that the setup violation is not detected.

Next, regarding the circuit configuration shown in FIG. 24, a timing chart in a case in which the buffer amount is increased to four stages is shown in FIG. 26. As in the above-described case, in FIG. 26 also, it is supposed that the supply voltage is reduced as the period proceeds and the delay overhead of 0.5 ns is generated in the data terminal D of each circuit (U1, U2, U3, U4). Therefore, in the fourth period, the slack of 1.5 ns is reduced from the first period.

In the first period shown in FIG. 26, the setup violation in the circuit U1 is detected (setup violation does not occur in other circuits U2, U3, U4). However, after the second period, the setup violation is continuously detected until the fourth period in which the setup violation occurs in the circuit U1. On the other hand, regarding the circuit U2, the setup violation is first detected in the second period, and the setup violation is detected until the fourth period. Regarding the circuit U3, the setup violation is first detected in the third period, and the setup violation is detected until the fourth period. Regarding the circuit U4, the setup violation is first detected in the fourth period.

Therefore, it is only necessary that the setup violation is detected after the second period, after the third period, and after the fourth period, regarding the circuit U2, U3 and U4, respectively. In the general circuit configuration, the lower limit of a voltage operation is determined, and it is not necessary to ensure the margin amount over the same. Therefore, by making the delay amount to be inserted to the circuits (U1, U2, U3, U4) smaller for the path of which slack is larger, it is possible to suppress the overhead of the area and the power consumption as much as possible without reducing the margin for detecting the malfunction.

Next, based on the timing chart shown in FIGS. 25 and 26, a circuit configuration in which the delay amount to be inserted is made optimal is shown in FIG. 27. In the circuit configuration shown in FIG. 27, the number of stages of the buffers is adjusted such that the smaller the slack of the circuit is, the larger the delay amount is. Specifically, in the circuit configuration shown in FIG. 27, since the slack of the circuit U1 is as small as 0 ns, the four stages of buffers (B4) are provided, and the three stages of buffers (B3), the two stages of buffers (B2), and the one stage of buffer (B1) are provided in the circuit U2 of which slack is 0.5 ns, the circuit U3 of which slack is 1.0 ns, and the circuit U4 of which slack is 1.5 ns, respectively.

That is to say, in the circuit configuration of the semiconductor device according to this embodiment, the slack of each delay path is analyzed after laying out the circuit, and the circuits (error detection FF) each having the slack not larger than the delay amount of one stage of buffer are grouped and are bundled. Also, in the circuit configuration of the semiconductor device according to this embodiment, the optimal buffer is inserted into the grouped circuits (error detection FF).

Figure 28:
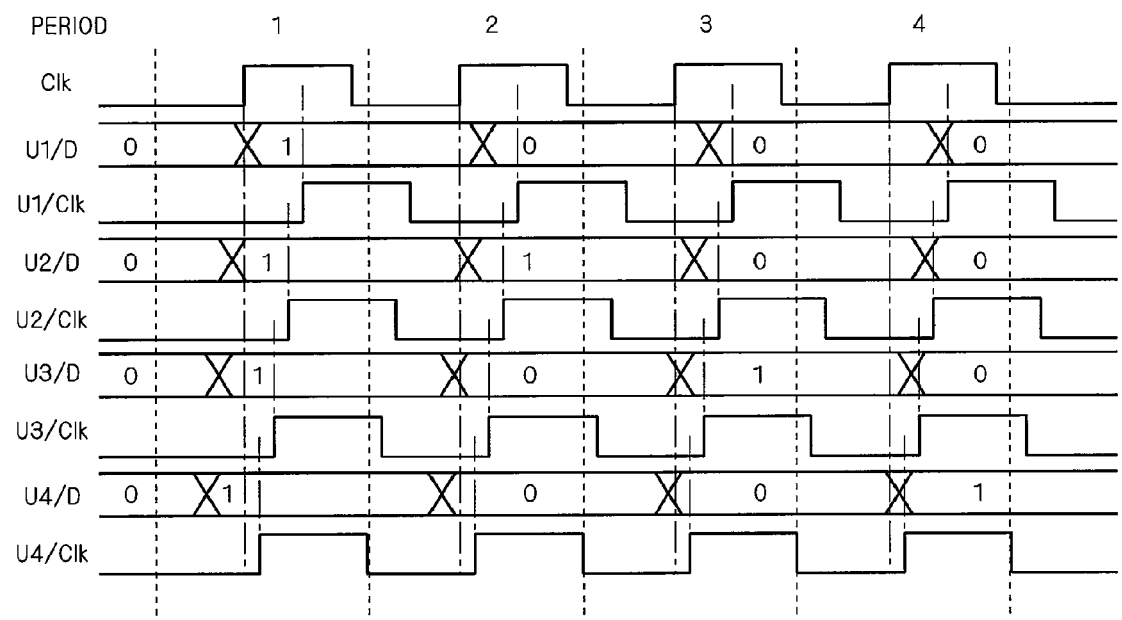
FIG. 28 is the timing chart of the malfunction judging circuit according to the sixth embodiment of the present invention.

A timing chart shown in FIG. 28 illustrates the operation of the circuit configuration shown in FIG. 27. Then, in the circuit configuration shown in FIG. 27, the setup violation is correctly detected in a portion in which the setup violation is necessarily checked (point at which the data signal D changes within a portion enclosed by the broken line). That is to say, in the timing chart shown in FIG. 28, the setup violation is detected after the first period, after the second period, after third period, and after the fourth period, regarding the circuits U1, U2, U3 and U4, respectively.

Seventh Embodiment

In the fifth embodiment, the malfunction judging circuits (error detection FF) included in the semiconductor device has been grouped by the slack and the buffer of the optimal amount has been inserted into the malfunction judging circuit of each group. However, it has been required to insert a number of buffers into the circuit of which slack is extremely small in the semiconductor device, so that there has been a problem that the overhead of the area and the power consumption becomes large.

Figure 29:
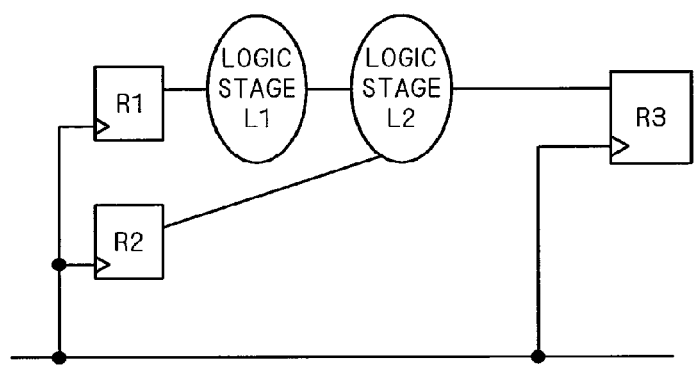
FIGS. 29 and 30 are views for illustrating a hold violation.
Figure 30:
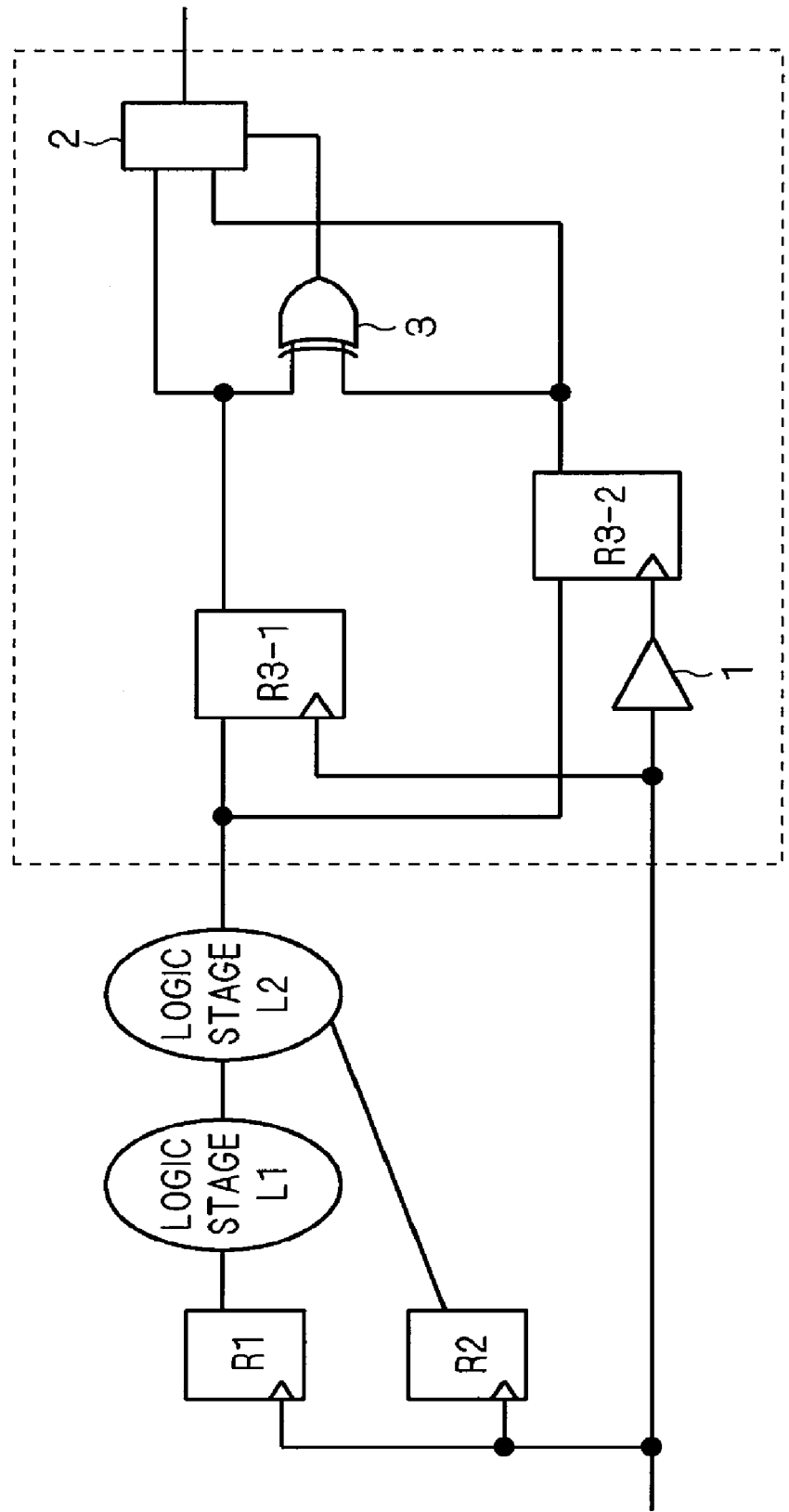

Hereinafter, it is described using the specific example. The circuit shown in FIG. 29 has a timing critical path from the register R1 to the register R3 as the path having the register R3 as an end point and another path such as from the register R2 to the register R3. In addition, the circuit configuration in a case in which the register R3 shown in FIG. 29 is replaced by the malfunction judging circuit (error detection FF) illustrated in FIG. 3 is shown in FIG. 30. In the circuit configuration shown in FIG. 30, although the path from the register R1 to the register R3-1 is the timing critical path, this also has a path from the register R2 to the register R3-2 other than this.

Figure 31:
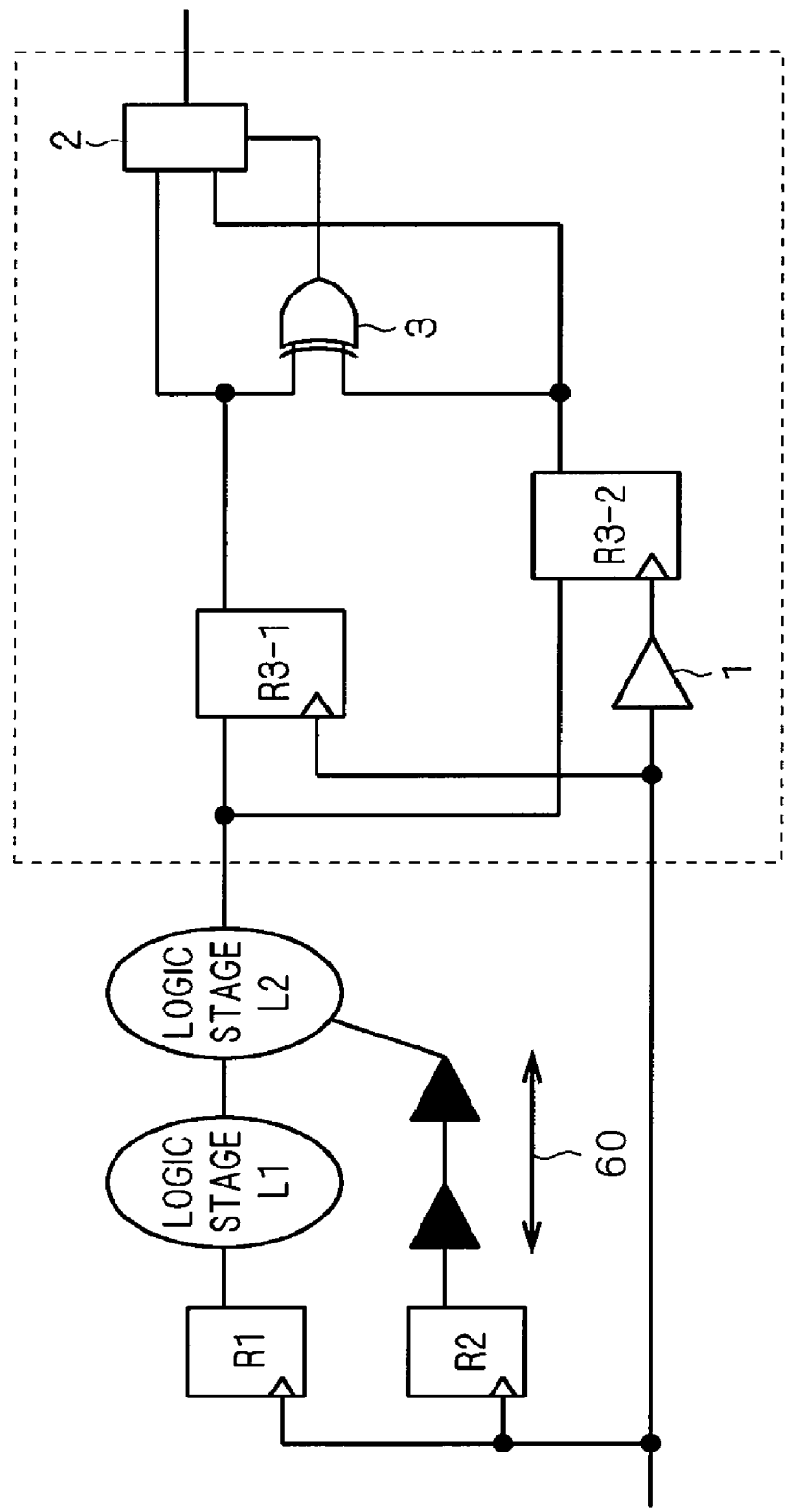
FIG. 31 is a view for illustrating measures for the hold violation.

However, if it is supposed that the hold violation occurs in the path from the register R2 to the register R3-2, it is necessary to insert the buffer or a delay cell into the path from the register R2 to the register R3-2 as measures for the hold violation. That is to say, when the delay amount of the buffer 1 inserted into the clock line of the register R3-2 is large, it is necessary to insert delay means 60 such as the buffer or the delay cell equivalent to the delay amount of the buffer 1 into the path from the register R2 to the register R3-2, as in the circuit configuration shown in FIG. 31. Therefore, in the circuit configuration shown in FIG. 31, there has been a problem that the overhead of the area and the power consumption becomes large.

Figure 32:
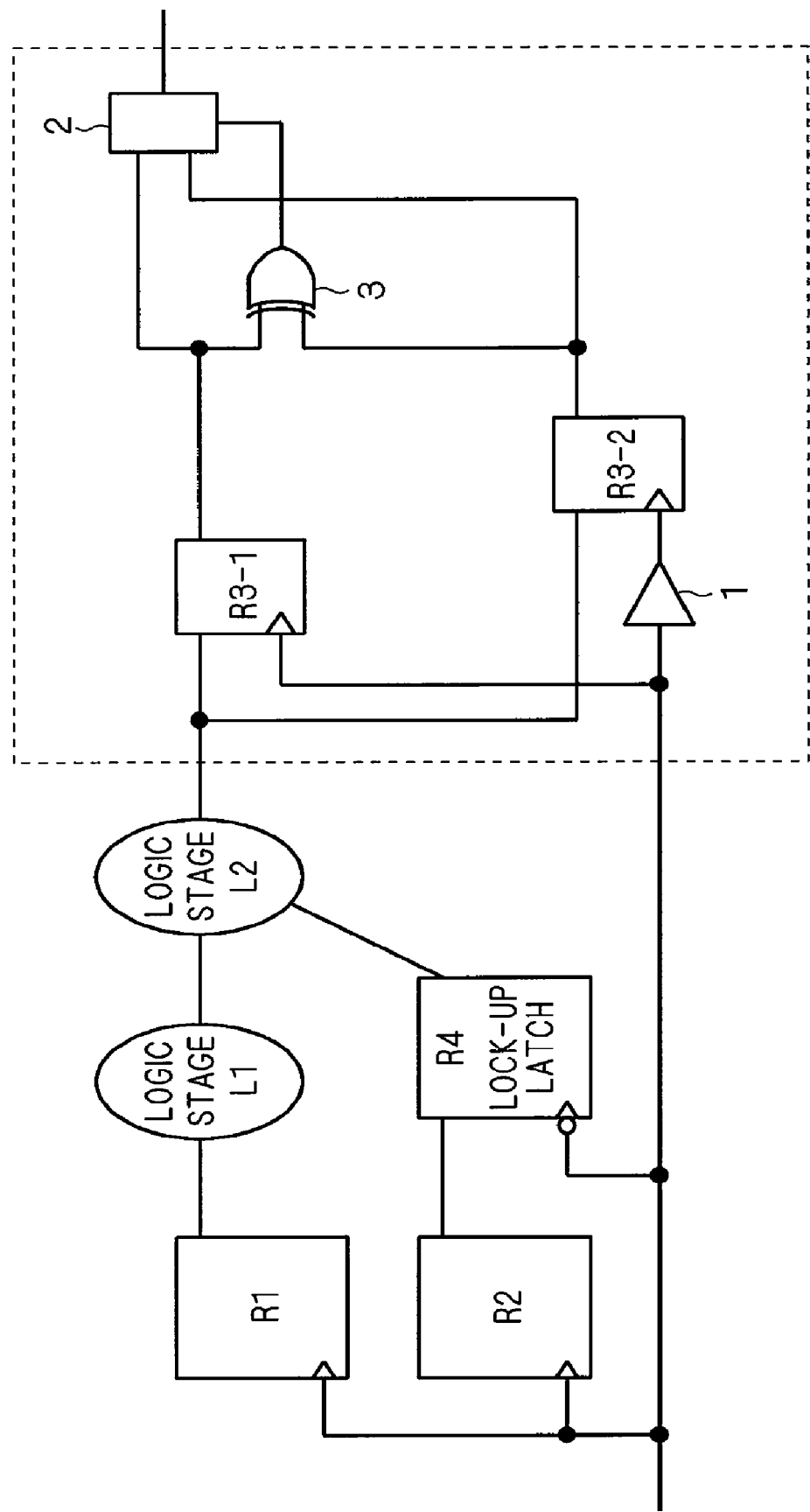
FIGS. 32 and 33 are circuit diagrams of a malfunction judging circuit according to a seventh embodiment of the present invention.

Then, in the semiconductor device according to this embodiment, in the circuit configuration having the path in which the hold violation occurs, the lock-up latch and an inverted FF are inserted in place of the buffer and the delay cell inserted as the measures for hold violation. That is to say, in this embodiment, as shown in FIG. 32, the register R4, which serves as the lock-up latch, into the path from the register R2 to the register R3-2. Alternatively, as shown in FIG. 33, the register R4, which serves as the inverted FF, into the path from the register R2 to the register R3-2.

Figure 33:
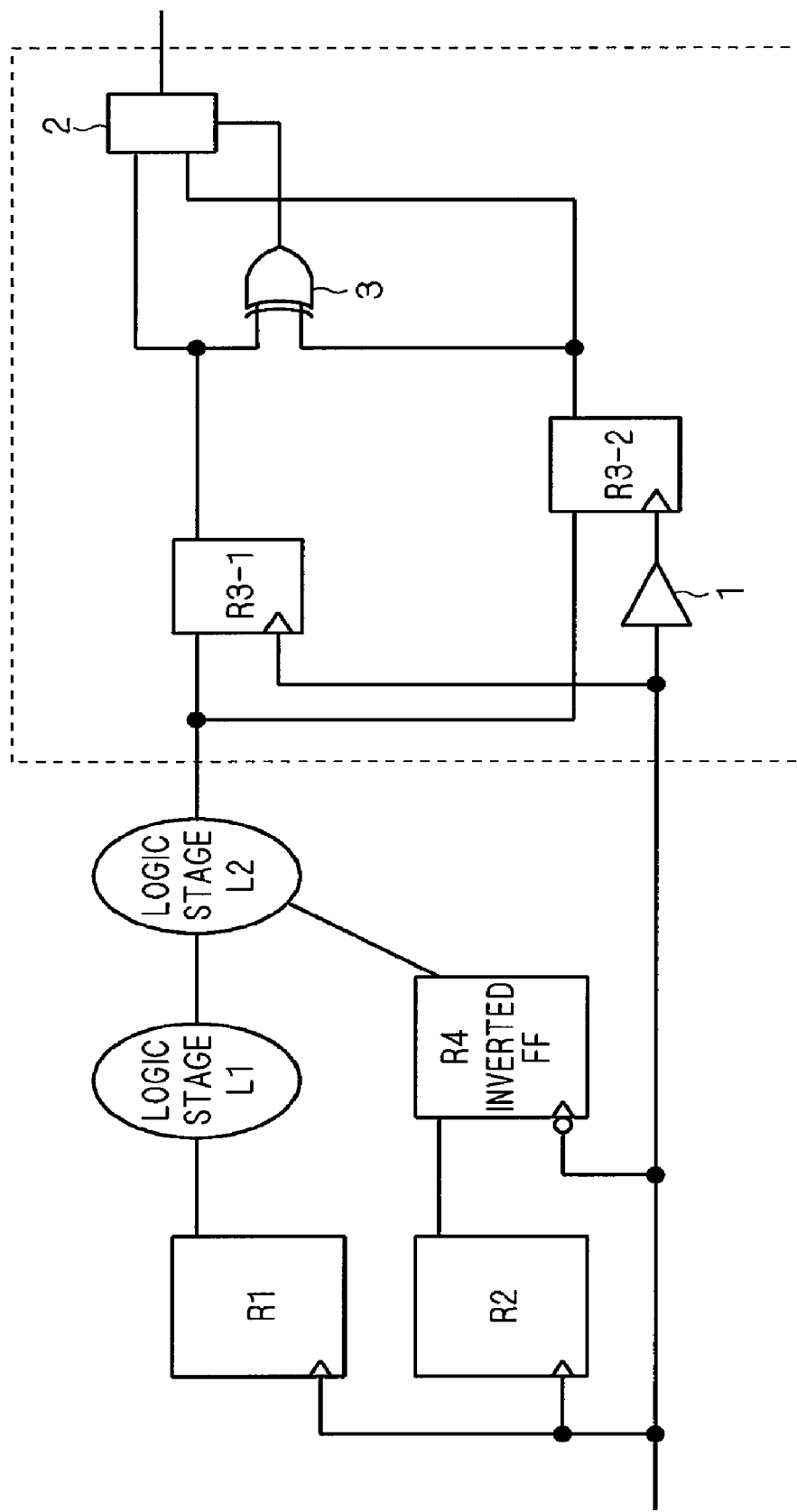

In the circuit configurations shown in FIGS. 32 and 33, by inserting the register R4, which serves as the lock-up latch or the inverted FF, in place of a number of buffer cells or delay cells, the delay of the half period of the clock signal may be gained, and the hold violation may be solved. Further, in the circuit configurations shown in FIGS. 32 and 33, it is not necessary to insert a number of buffer cell or the delay cell as in the circuit configuration shown in FIG. 31, it is possible to reduce the overhead of the area and the power consumption.

Figure 34:
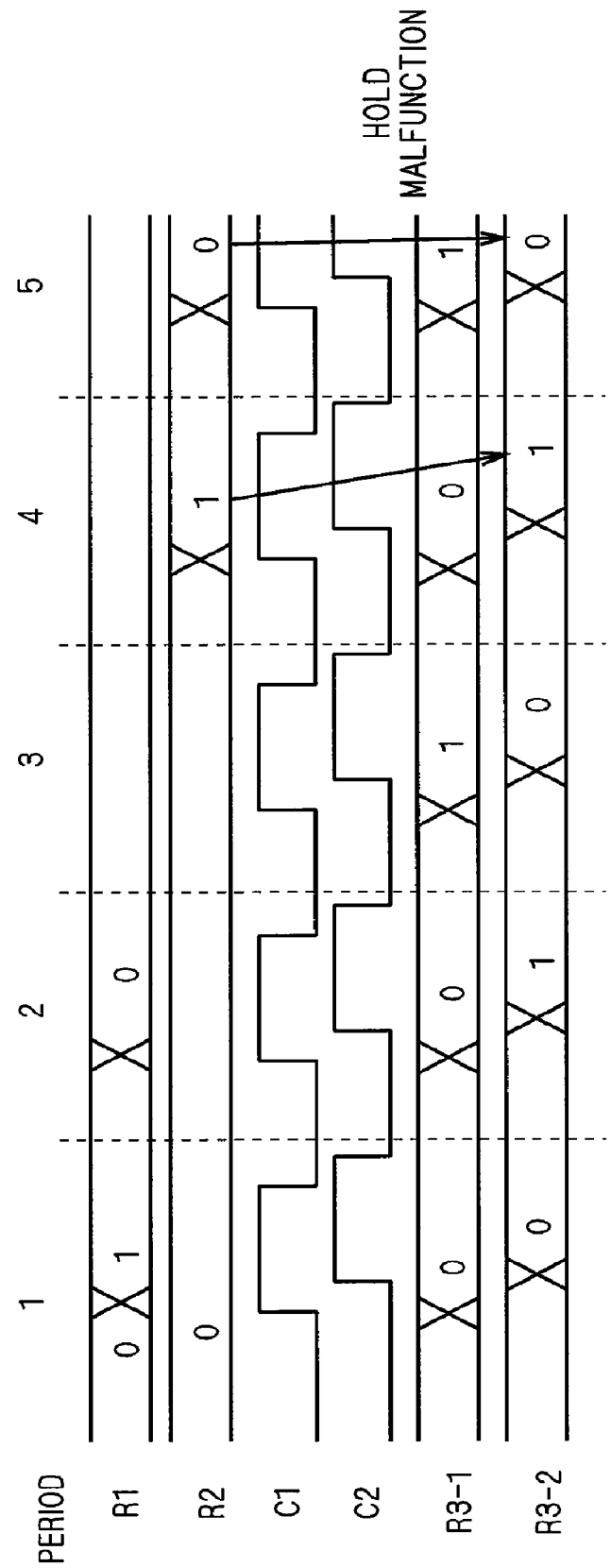
FIG. 34 is a timing chart of the malfunction judging circuit in which the hold violation occurs.

Next, the operation of the circuit configuration shown in FIG. 30 in which the hold violation occurs is described using a timing chart shown in FIG. 34. Meanwhile, in the circuit configuration shown in FIG. 30, the setup violation occurs in the path from the register R1 to the register R3-1 and the expectation value is obtained from the path from the register R1 to the register R3-2. Also, in the circuit configuration shown in FIG. 30, the path from the register R2 to the register R3-2 is the path in which the hold violation occurs. Also, in a following operational description, it is supposed that the logic of each timing path is whenever a positive logic in order to simplify the operation.

First, in the first period shown in FIG. 34, the contents of the register R1 transit from "0" to "1" at the rising of the clock signal C1.

Next, in the second period shown in FIG. 34, the value is to be determined according to the rise event of the register R1 in the first period, however, since the setup violation occurs in the register R3-1, this may not capture "1" and remains to be "0". On the other hand, the register R3-2 may normally capture "1" by the delayed clock signal C2. Further, the next fall event from "1" to "0" occurs in the register R1.

Next, in the third period shown in FIG. 34, as in the second period, the value is to be determined according to the fall event of the register R1 in the second period, however, since the setup violation occurs in the register R3-1, this may not capture "0" and captures "1", which is the determined value in the previous period. On the other hand, the register R3-2 may normally capture "0" by the delayed clock signal C2.

Next, in the fourth period shown in FIG. 34, the contents of the register R2 transit from "0" to "1" at the rising of the clock signal C1. Therefore, the event of the register R2 is essentially scheduled to be reflected as the transit of the registers R3-1 and R3-2 in the fifth period, which is the subsequent cycle. However, since the hold violation occurs in the register R3-2, this captures "1" in the fourth period as indicated by an arrow in the drawing. That is to say, the register R3-2, which is the expectation value register, holds a wrong result in the fourth period.

Next, in the fifth period shown in FIG. 34, the contents of the register R2 transit from "1" to "0" at the rising of the clock signal C1. Therefore, the event of the register R2 is essentially scheduled to be reflected as the transit of the registers R3-1 and R3-2 in the sixth period, which is the subsequent cycle. However, since the hold violation occurs in the register R3-2, this captures "0" in the fifth period as indicated by the arrow in the drawing, as in the fourth period.

Figure 35:
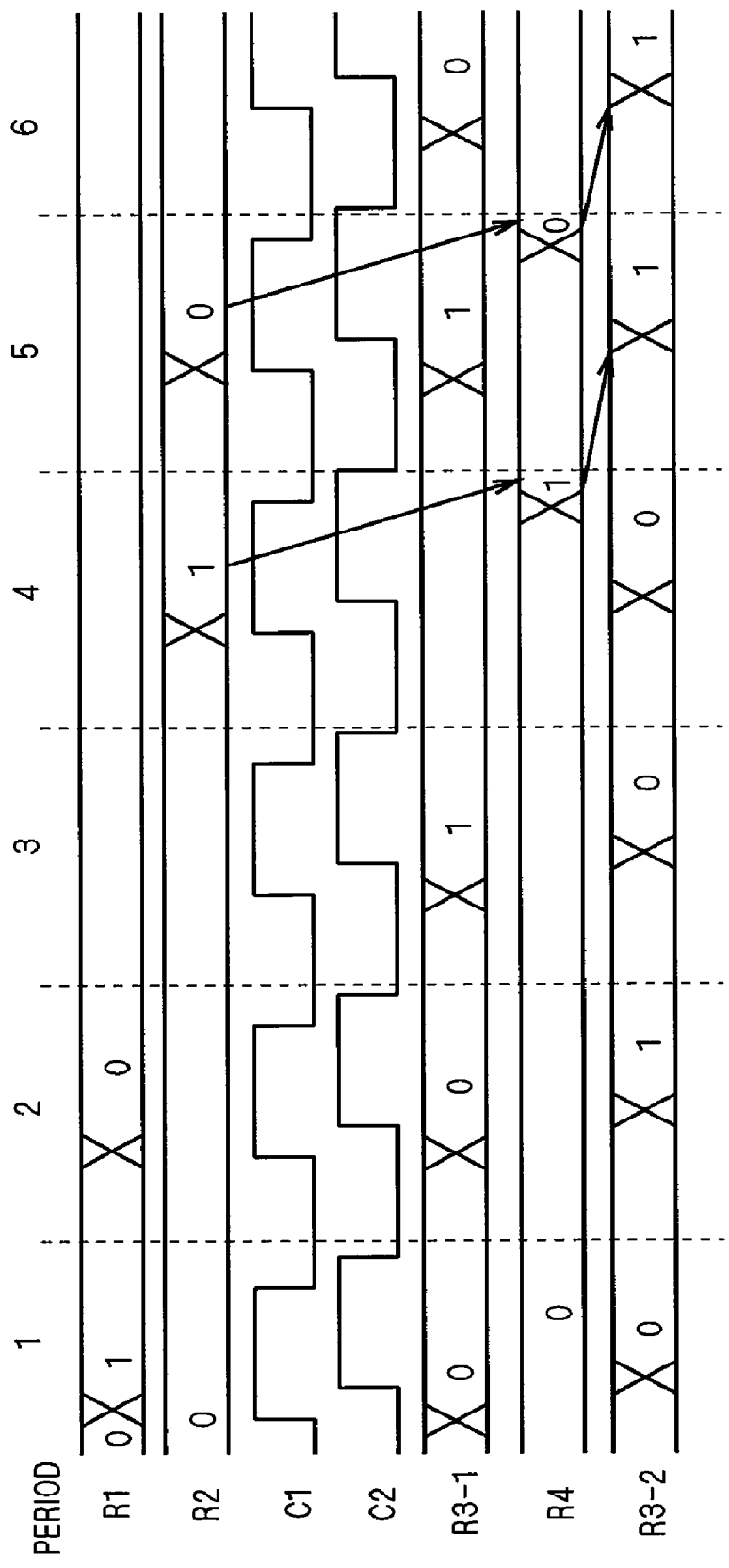
FIG. 35 is a timing chart of the malfunction judging circuit according to the seventh embodiment of the present invention.

Next, the operation of the circuit configuration shown in FIG. 32 or FIG. 33 in which the register R4, which serves as the lock-up latch or the inverted FF, is inserted into the path from the register R2 to the register R3-2 as the measures for hold violation is described using a timing chart of FIG. 35.

Meanwhile, in the timing chart shown in FIG. 35, the clock signal C2 transmits the event with a delay by the amount of the insertion buffer relative to the clock signal C1. Also, in the timing chart shown in FIG. 35, each of the registers R1, R2 and R3-1 captures the data signal at the rising edge of the clock signal C1, the register R3-2 captures the data signal at the rising of the clock signal C2, and the register R4 captures the data at the trailing edge of the clock signal C1.

Next, in the timing chart shown in FIG. 35, operation from the first period to the third period is equivalent to the operation of the timing chart shown in FIG. 34, so that the detailed description is omitted.

Next, in the fourth period shown in FIG. 35, the contents of the register R2 transit from "0" to "1" at the rising of the clock signal C1. Although the register R3-2 has been the path in which the hold violation occurs, the lock-up latch or the inverted FF is inserted between the registers R2 and R3-2, as shown in FIG. 32 or FIG. 33. Therefore, in the fourth period shown in FIG. 35, the event "1" generated in the register R2 is not directly captured by the register R3-2, and this is once captured by the register R4 at the trailing of the clock signal C1 and then captured by the register R3-2 in the fifth period.

Next, in the fifth period shown in FIG. 35, "1" captured by the register R4 is captured by the register R3-1 at the rising of the clock signal C1 and captured by the register R3-2 at the rising of the clock signal C2. Also, although the contents of the register R2 transit from "1" to "0" at the rising of the clock signal C1, as in the fourth period, the register R3-2 does not directly capture the event "0" generated in the register R2, and once captures the same at the trailing of the clock signal C1 as indicated by the arrow in the drawing.

Next, in the sixth period shown in FIG. 35, the register R3-1 captures "0" captured by the register R4 at the rising of the clock signal C1, and the register R3-2 captures the same at the rising of the clock signal C2.

As described above, in the semiconductor device according to this embodiment, by adopting the circuit configuration shown in FIG. 32 or 33, the overhead of the area and the power consumption is reduced and the malfunction due to the hold violation is avoided, so that the data may be correctly transferred.

Eighth Embodiment

In the sixth embodiment, the delay paths are grouped by the speed margin and the optimal delay amount is inserted into each group. Specifically, the effect of suppressing the increase in the circuit size and the power consumption by inserting the buffer B2 separately and setting the optimal insertion buffer amount has been described. However, to change the insertion buffer amount individually means to assign one clock domain for every error detection FF, and it might be that control of clock skew and latency does not operate well when actually placing and routing, so that desired circuit size or power consumption may not be obtained.

Figure 36:
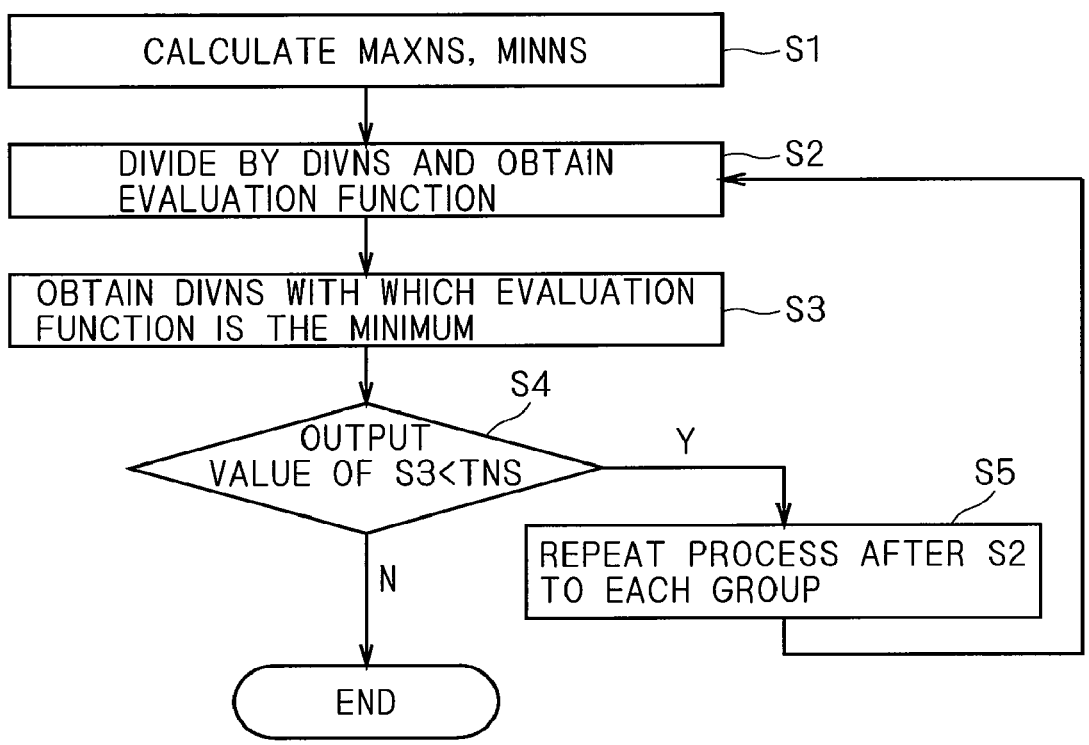
FIG. 36 is a flowchart for illustrating an algorithm according to an eighth embodiment of the present invention.

Therefore, in this embodiment, an optimal grouping method considering the above-described risk is described. First, a flowchart of an algorithm of the grouping performed in this embodiment is shown in FIG. 36. For example, the flowchart shown in FIG. 36 is described for a case in which there are 21 delay paths. The negative-slacks of the 21 paths are supposed to be 0.048, 0.048, 0.045, 0.045, 0.036, 0.035, 0.033, 0.027, 0.024, 0.022, 0.021, 0.019, 0.017, 0.015, 0.015, 0.008, 0.007, 0.006, 0.005, 0.001 and 0.001, respectively. Meanwhile, although the general negative-slack is a negative value, in order to simplify the description, they are represented as positive values.

In a step S1 of a flowchart shown in FIG. 36, a Maximum-Negative-Slack (MaxNS), a Minimum-Negative-Slack (MinNS: initial value is 0) and a Total-Negative-Slack (TNS) are calculated. Further, the TNS calculated in the step S1 is made initial criteria. Specifically, MaxNS=0.048, MinNS=0.0 and TNS=0.478.

Figure 37:
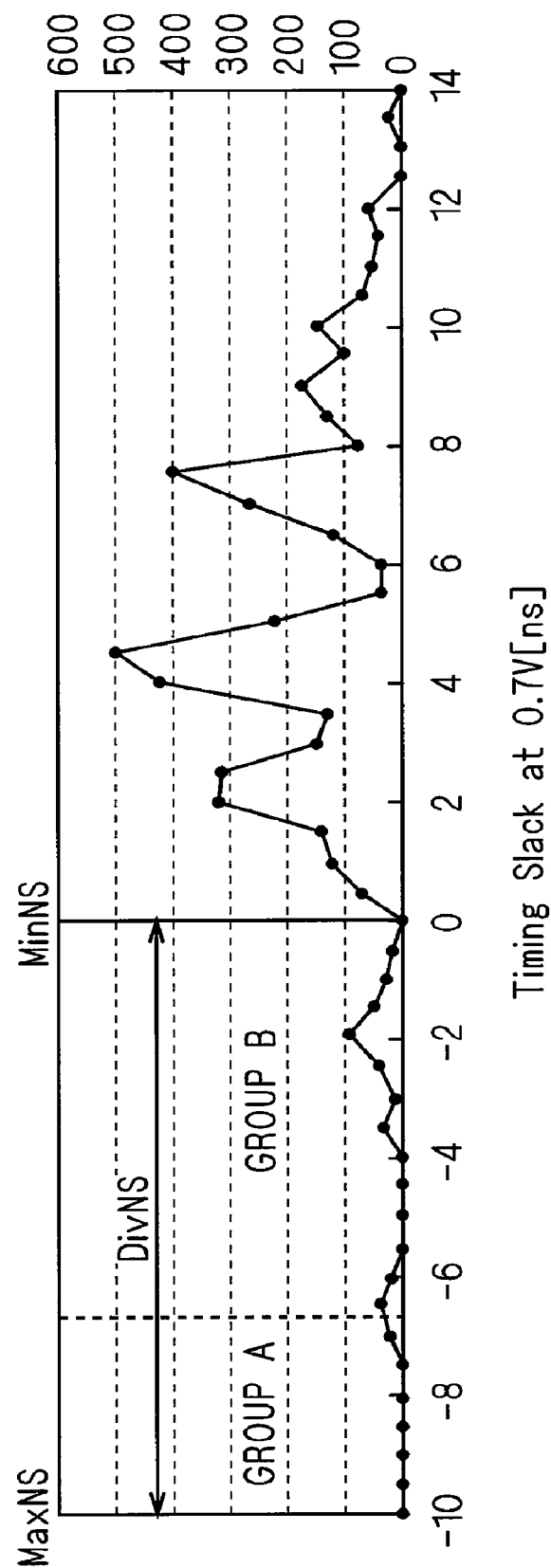
FIG. 37 is a view for illustrating a delay path grouped by the algorithm according to the eighth embodiment of the present invention.

Next, in a step S2, an optional negative-slack from the MaxNS to the MinNS is selected as DivNS (selected value), and all of the delay paths belonging to from the MaxNS to DivNS are made a group A and all of the delay paths belonging to from DivNS to MinNS are made a group B. As in FIG. 37 representing a slack timing at 0.7V, the delay paths from MaxNS to MinNS are divided into the groups A and B with a border DivNS. Further, in the step S2, a sum of differences from each delay path belonging to the group A to DivNS and the sum of differences from each delay path belonging to the group B to MinNS are calculated, respectively, and the sums of the both differences is made an evaluation function to be the Total-Negative-Slack (TNS).

Next, in a step S3, DivNS is sequentially swept between MaxNS and MinNS to obtain DivNS at which Total-Negative-Slack (TNS), which is the evaluation function, is the minimum. Specifically, in the above example, DivNS is swept from MaxNS (0.048) to MinNS (0.0) to decide DivNS at which TNS is the minimum. Meanwhile, in this example, since a sweep accuracy of DivNS is made 0.01, the values, which DivNS may take, are 0.00, 0.01, 0.02, 0.03 and 0.04. Possible TNS of each DivNS is TNS=0.478 when DivNS=0.00, TNS=0.328 when DivNS=0.01, TNS=0.258 when DivNS=0.02, TNS=0.268 when DivNS=0.03 and TNS=0.318 when DivNS=0.04, respectively.

Next, in the step S4, a value obtained by assigning predetermined weights to minimum DivNS obtained in the step S3 and the criteria before this division are compared, and if the value is larger, the process is finished, if this is smaller, the division process of this time is accepted and an obtained value is updated as new criteria. In the above-described example, since the minimum value of TNS is 0.258 at the time of DivNS=0.02, this value and the initial criteria (0.478) are compared. If a weight function of this time is 1.5*TNS+0.05, a value obtained by assigning weights is 0.437 and is smaller than the criteria, so that this division is accepted and it is divided as follows. The group A is 0.048, 0.048, 0.045, 0.045, 0.036, 0.035, 0.033, 0.027, 0.024, 0.022 and 0.021 and the group B is 0.019, 0.017, 0.015, 0.015, 0.008, 0.007, 0.006, 0.005, 0.001 and 0.001. At that time, the criteria are updated from 0.478 to 0.258.

Next, in a step S5, the similar process is recursively performed regarding the divided two groups. The minimum value of TNS in the group A is 0.084 at the time of DivNS=0.04, and the value obtained by assigning weights is 0.176, so that the division is accepted. The criteria at that time are updated to 0.084. Also, the minimum value of TNS in the group B is 0.054 at the time of DivNS=0.01 and the value obtained by assigning weights is 0.131, so that the divisions are accepted. The criteria at that time are updated to 0.054.

Therefore, the group after the above-division is accepted is as follows. The Group A-A (G-A-A) is 0.048, 0.048, 0.045 and 0.045, the group A-B (GA-B) is 0.036, 0.035, 0.033, 0.027, 0.024, 0.022 and 0.021, the group B-A (GB-A) is 0.019, 0.017, 0.015 and 0.015, the group B-B (GB-B) is 0.008, 0.007, 0.006, 0.0050.001 and 0.001. At that time, since the groups A-A, B-A and B-B are no more divided with an accuracy of 0.01 of DivNS, the division process is stopped, and the division process is continued for only the group A-B.

The minimum value of TNS in the group A-B is 0.028 at the time of DivNS=0.03, and the value obtained by assigning weights is 0.092, so that the division is rejected for this is larger than the criteria, 0.084. Therefore, when the 21 paths, which are the above-described delay paths, are divided by applying the algorithm shown in FIG. 36, they are grouped into the above-described four patterns (groups A-A, A-B, B-A and B-B).

Figure 38:
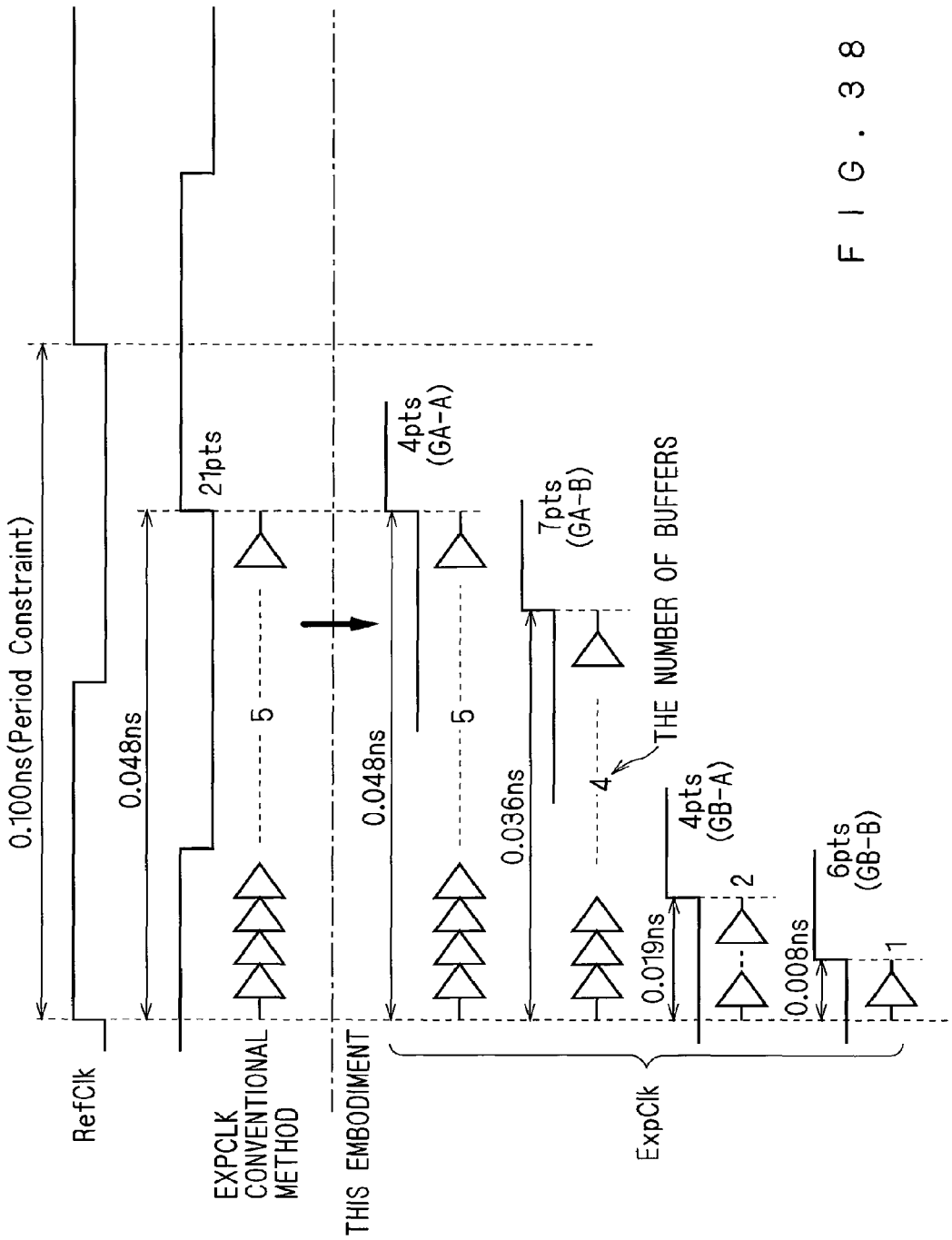
FIGS. 38 and 39 are schematic diagrams for illustrating an effect of the algorithm according to the eighth embodiment of the present invention.

Next, an effect of grouping the delay paths by using the algorithm shown in FIG. 36 is described. FIG. 38 is a schematic diagram for illustrating the delay paths to which the above-described grouping has been performed. In the conventional procedure, the buffer for compensating the delay of the maximum slack of 0.048 ns has been inserted to all of the 21 paths. When setting a hold overhead function to delay amount*the number of paths, an overhead index is represented as 0.048*21=1.008.

On the other hand, in this embodiment, the inserted delay amount becomes the critical slack of each group, so that the inserted delay amount of the group A-A remains to be 0.048 ns as shown in FIG. 38, that of the groups A-B, B-A and B-B are reduced to 0.036 ns, 0.019 ns and 0.008 ns, respectively. Thereby, the overhead index is represented as $$0.048*4+0.036*7+0.019*4+0.008*6=0.568.$$

Therefore, it is understood that the overhead index is reduced to 0.568/1.008*100=56.3%. Also, in FIG. 38, the number of insertion buffers to be inserted to each group is shown, and in the conventional procedure and the group A-A, this is 5, in the group A-B, this is 4, in the group B-A, this is 2, and in the group B-B, this is 1.

Figure 39:
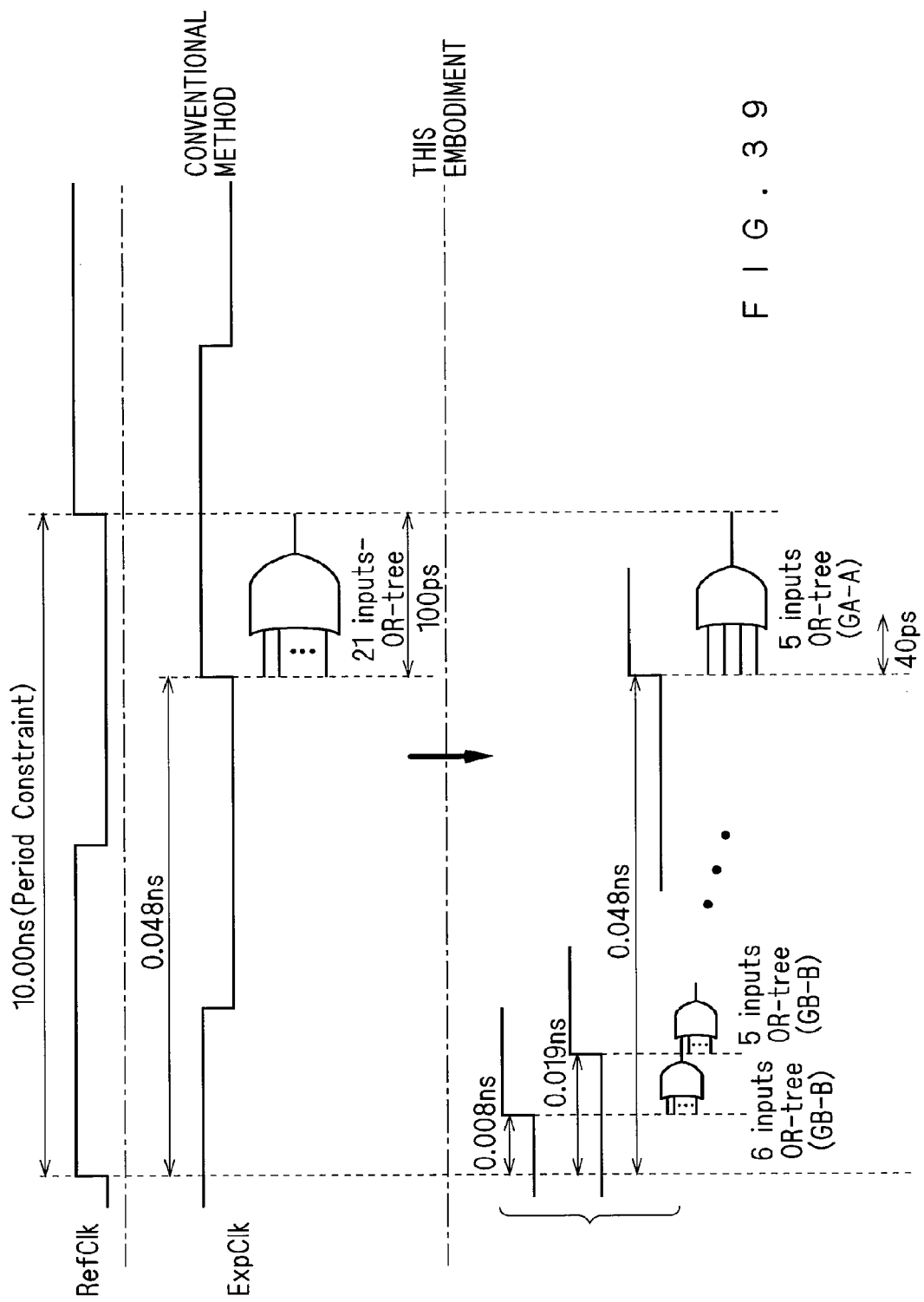

Further, in this embodiment, by dividing the logic as shown in FIG. 39 and performing a part of processes in advance, latency may also be reduced.

If even one of the error detection FF dispersed in the applied circuit is failed, the error detection has to output an alert signal of this, so that a logic sum of each error detection signal has to be obtained. In the conventional procedure, the error detection of all of the 21 paths is performed after the clock phase difference of the maximum slack of 0.048 ns, the logic sums of 21 inputs have to be processed at once. It has required 100 ps for this process.

On the other hand, in this embodiment, the inserted delay amount is the critical slack of each group, so that the inserted delay amount of the group A-A remains to be 0.048 ns as shown in FIG. 38, however, that of the group A-B becomes 0.036 ns, that of the group B-A becomes 0.019 ns and that of the group B-B becomes 0.08 ns, and the error detection is performed in each timing, thereby each logic sum may be processed in advance in the order of the group B-B, the group B-A and the group A-B. If the process of the logic sum until the group A-B is finished until the clock phase difference of the group A-A, in this embodiment, it is only necessary to process the logic sum of five inputs, which are the transmission signal and the four paths, which belong to the group A-A. It is supposed that 40 ps is required for this process. Therefore, in this embodiment it is understood that latency also is reduced to 40/100*100=40.0%.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising a plurality of logic circuits and a plurality of judging circuits for judging malfunction based on data from said logic circuits, wherein each of said judging circuits comprises:
   a first clock control unit for controlling a transmission of a clock signal based on an enable signal;
   a first register for capturing the data from said logic circuits in a predetermined timing of said clock signal controlled by said first clock control unit;
   a first delay unit for delaying said clock signal;
   a second clock control unit for controlling a transmission of said clock signal, which has passed through said first delay unit, based on said enable signal;
   a second register logically equivalent to said first register for capturing the data from said logic circuits in a predetermined timing of said clock signal controlled by said second clock control unit; and
   a comparator for comparing an output from said first register and an output from said second register to output an error signal, and wherein said semiconductor device further comprises a detection circuit for detecting a setup violation of said enable signal, with respect to a plurality of said judging circuits for controlling said clock signal by said same enable signal.

2. The semiconductor device according to claim 1, wherein said detection circuit comprises:
   a third register for capturing said enable signal in a predetermined timing of said clock signal;
   a second delay unit for delaying said clock signal; and
   a fourth register logically equivalent to said third register, for capturing said enable signal in a predetermined timing of said clock signal, which has passed through said second delay unit.

* * * * *